(12) United States Patent
Yamazaki

(10) Patent No.: US 9,411,208 B2
(45) Date of Patent: Aug. 9, 2016

(54) DISPLAY DEVICE

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/740,599

(22) Filed: Jun. 16, 2015

(65) Prior Publication Data

US 2015/0309347 A1 Oct. 29, 2015

Related U.S. Application Data

(63) Continuation of application No. 14/154,534, filed on Jan. 14, 2014, now Pat. No. 9,070,596, which is a continuation of application No. 13/594,934, filed on Aug. 27, 2012, now Pat. No. 8,637,863, which is a continuation of application No. 12/959,989, filed on Dec. 3, 2010, now Pat. No. 8,269,218.

(30) Foreign Application Priority Data

Dec. 4, 2009 (JP) ................................. 2009-276454

(51) Int. Cl.
*H01L 29/12* (2006.01)
*H01L 27/12* (2006.01)
(Continued)

(52) U.S. Cl.
CPC ............ *G02F 1/1368* (2013.01); *G02F 1/1337* (2013.01); *H01L 27/1225* (2013.01); *H01L 29/7869* (2013.01); *H01L 29/78606* (2013.01); *H01L 29/78648* (2013.01)

(58) Field of Classification Search
CPC ................... H01L 27/1225; H01L 29/78606; H01L 29/7869

USPC ..................................................... 257/43, 347
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 001527649 A 9/2004
EP 1737044 A 12/2006
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Luan C Thai
(74) *Attorney, Agent, or Firm* — Fish & Richardson P.C.

(57) ABSTRACT

One object is to provide a transistor including an oxide semiconductor film which is used for the pixel portion of a display device and has high reliability. A display device has a first gate electrode; a first gate insulating film over the first gate electrode; an oxide semiconductor film over the first gate insulating film; a source electrode and a drain electrode over the oxide semiconductor film; a second gate insulating film over the source electrode, the drain electrode and the oxide semiconductor film; a second gate electrode over the second gate insulating film; an organic resin film having flatness over the second gate insulating film; a pixel electrode over the organic resin film having flatness, wherein the concentration of hydrogen atoms contained in the oxide semiconductor film and measured by secondary ion mass spectrometry is less than $1\times10^{16}$ cm$^{-3}$.

20 Claims, 26 Drawing Sheets

(51) Int. Cl.
*G02F 1/1368* (2006.01)
*H01L 29/786* (2006.01)
*G02F 1/1337* (2006.01)

(56) References Cited

U.S. PATENT DOCUMENTS

| | | |
|---|---|---|
| 6,001,539 A | 12/1999 | Lyu et al. |
| 6,005,648 A | 12/1999 | Zhang et al. |
| 6,097,454 A | 8/2000 | Zhang et al. |
| 6,100,954 A | 8/2000 | Kim et al. |
| 6,188,452 B1 | 2/2001 | Kim et al. |
| 6,211,928 B1 | 4/2001 | Oh et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,885,146 B2 | 4/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,145,174 B2 | 12/2006 | Chiang et al. |
| 7,145,176 B2 | 12/2006 | Kawasaki et al. |
| 7,211,825 B2 | 5/2007 | Shih et al |
| 7,262,463 B2 | 8/2007 | Hoffman |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,598,520 B2 | 10/2009 | Hirao et al. |
| 7,601,984 B2 | 10/2009 | Sano et al. |
| 7,635,889 B2 | 12/2009 | Isa et al. |
| 7,674,650 B2 | 3/2010 | Akimoto et al. |
| 7,732,251 B2 | 6/2010 | Hoffman et al. |
| 7,732,819 B2 | 6/2010 | Akimoto et al. |
| 7,767,595 B2 | 8/2010 | Tanaka et al. |
| 7,791,074 B2 | 9/2010 | Iwasaki |
| 7,935,964 B2 | 5/2011 | Kim et al. |
| 7,998,372 B2 | 8/2011 | Yano et al. |
| 8,003,981 B2 | 8/2011 | Iwasaki et al. |
| 8,013,331 B2 | 9/2011 | Wakita |
| 8,067,775 B2 | 11/2011 | Miyairi et al. |
| 8,168,544 B2 | 5/2012 | Chang |
| 8,202,365 B2 | 6/2012 | Umeda et al. |
| 8,203,144 B2 | 6/2012 | Hoffman et al. |
| 8,207,756 B2 | 6/2012 | Shionoiri et al. |
| 8,236,635 B2 | 8/2012 | Suzawa et al. |
| 8,242,494 B2 | 8/2012 | Suzawa et al. |
| 8,247,813 B2 | 8/2012 | Koyama et al. |
| 8,293,661 B2 | 10/2012 | Yamazaki |
| 8,304,765 B2 | 11/2012 | Yamazaki et al. |
| 8,309,961 B2 | 11/2012 | Yamazaki et al. |
| 8,319,215 B2 | 11/2012 | Yamazaki et al. |
| 8,324,018 B2 | 12/2012 | Isa et al. |
| 8,324,621 B2 | 12/2012 | Yamazaki et al. |
| 8,343,799 B2 | 1/2013 | Ito et al. |
| 8,367,489 B2 | 2/2013 | Yamazaki |
| 8,586,979 B2 | 11/2013 | Son et al. |
| 8,647,031 B2 | 2/2014 | Hoffman et al. |
| 8,803,768 B2 | 8/2014 | Kimura et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0145143 A1 | 10/2002 | Kawasaki et al. |
| 2003/0173890 A1 | 9/2003 | Yamazaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199879 A1 | 9/2005 | Hoffman et al. |
| 2005/0199959 A1 | 9/2005 | Chiang et al. |
| 2005/0199960 A1 | 9/2005 | Hoffman et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0099747 A1 | 5/2006 | Park |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0228389 A1 | 10/2007 | Hsu et al. |
| 2007/0252928 A1 | 11/2007 | Ito et al. |
| 2007/0272922 A1 | 11/2007 | Kim et al. |
| 2007/0278490 A1 | 12/2007 | Hirao et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0057605 A1 | 3/2008 | Morisue et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108229 A1 | 5/2008 | Tanaka et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0248609 A1 | 10/2008 | Yamazaki et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0008638 A1 | 1/2009 | Kang et al. |
| 2009/0045397 A1 | 2/2009 | Iwasaki |
| 2009/0068773 A1 | 3/2009 | Lai et al. |
| 2009/0072232 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140337 A1 | 6/2009 | Yamazaki |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0206332 A1 | 8/2009 | Son et al. |
| 2009/0224239 A1 | 9/2009 | Wakita |
| 2009/0239335 A1 | 9/2009 | Akimoto et al. |
| 2009/0278122 A1 | 11/2009 | Hosono et al. |

(56) References Cited

U.S. PATENT DOCUMENTS

| | | |
|---|---|---|
| 2009/0280600 A1 | 11/2009 | Hosono et al. |
| 2009/0286351 A1 | 11/2009 | Hirao et al. |
| 2009/0315026 A1* | 12/2009 | Jeong ................ H01L 29/7869 257/43 |
| 2010/0051935 A1 | 3/2010 | Lee et al. |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0084648 A1 | 4/2010 | Watanabe |
| 2010/0084650 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0102313 A1 | 4/2010 | Miyairi et al. |
| 2010/0105163 A1 | 4/2010 | Ito et al. |
| 2010/0109002 A1 | 5/2010 | Itagaki et al. |
| 2010/0117075 A1 | 5/2010 | Akimoto et al. |
| 2010/0117999 A1 | 5/2010 | Matsunaga et al. |
| 2010/0123136 A1 | 5/2010 | Lee et al. |
| 2010/0129528 A1 | 5/2010 | Yamazaki et al. |
| 2010/0140599 A1 | 6/2010 | Yano et al. |
| 2010/0155717 A1 | 6/2010 | Yano et al. |
| 2010/0219411 A1 | 9/2010 | Hoffman et al. |
| 2010/0244022 A1 | 9/2010 | Takahashi et al. |
| 2010/0301326 A1 | 12/2010 | Miyairi et al. |
| 2010/0301329 A1 | 12/2010 | Asano et al. |
| 2011/0049509 A1 | 3/2011 | Takahashi et al. |
| 2011/0062433 A1 | 3/2011 | Yamazaki |
| 2011/0062436 A1 | 3/2011 | Yamazaki et al. |
| 2011/0068335 A1 | 3/2011 | Yamazaki et al. |
| 2011/0084263 A1 | 4/2011 | Yamazaki et al. |
| 2011/0108837 A1 | 5/2011 | Yamazaki et al. |
| 2011/0109351 A1 | 5/2011 | Yamazaki et al. |
| 2011/0117698 A1 | 5/2011 | Suzawa et al. |
| 2011/0127521 A1 | 6/2011 | Yamazaki |
| 2011/0127523 A1 | 6/2011 | Yamazaki |
| 2011/0127579 A1 | 6/2011 | Yamazaki |
| 2011/0133191 A1 | 6/2011 | Yamazaki |
| 2011/0210355 A1 | 9/2011 | Yamazaki et al. |
| 2011/0256684 A1 | 10/2011 | Iwasaki et al. |
| 2012/0205651 A1 | 8/2012 | Lee et al. |
| 2012/0256179 A1 | 10/2012 | Yamazaki et al. |
| 2013/0277672 A1 | 10/2013 | Sano et al. |
| 2014/0346506 A1 | 11/2014 | Kimura et al. |

FOREIGN PATENT DOCUMENTS

| | | |
|---|---|---|
| EP | 1918904 A | 5/2008 |
| EP | 2086013 A | 8/2009 |
| EP | 2226847 A | 9/2010 |
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-163528 A | 6/1992 |
| JP | 05-251705 A | 9/1993 |
| JP | 07-168170 A | 7/1995 |
| JP | 08-264794 A | 10/1996 |
| JP | 09-096836 A | 4/1997 |
| JP | 10-010580 A | 1/1998 |
| JP | 10-041519 A | 2/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-305306 A | 10/2002 |
| JP | 2003-041362 A | 2/2003 |
| JP | 2003-086000 A | 3/2003 |
| JP | 2003-086808 A | 3/2003 |
| JP | 2003-337353 A | 11/2003 |
| JP | 2004-103957 A | 4/2004 |
| JP | 2004-273614 A | 9/2004 |
| JP | 2004-273732 A | 9/2004 |
| JP | 2006-237586 A | 9/2006 |
| JP | 2006-302860 A | 11/2006 |
| JP | 2007-096055 A | 4/2007 |
| JP | 2007-103918 A | 4/2007 |
| JP | 2007-123861 A | 5/2007 |
| JP | 2007-250983 A | 9/2007 |
| JP | 2007-273956 A | 10/2007 |
| JP | 2007-529117 | 10/2007 |
| JP | 2007-529119 | 10/2007 |
| JP | 2008-134625 A | 6/2008 |
| JP | 2008-135717 A | 6/2008 |
| JP | 2008-243929 A | 10/2008 |
| JP | 2009-099847 A | 5/2009 |
| JP | 2009-167087 A | 7/2009 |
| JP | 2009-176865 A | 8/2009 |
| JP | 2009-528670 | 8/2009 |
| KR | 2007-0090182 A | 9/2007 |
| KR | 2009-0084642 A | 8/2009 |
| TW | 200534367 | 10/2005 |
| WO | WO-2004/114391 | 12/2004 |
| WO | WO-2005/093847 | 10/2005 |
| WO | WO-2005/093850 | 10/2005 |
| WO | WO-2006/051993 | 5/2006 |
| WO | WO-2007/029844 | 3/2007 |
| WO | WO-2007/058231 | 5/2007 |
| WO | WO-2007/108293 | 9/2007 |
| WO | WO-2007/119386 | 10/2007 |
| WO | WO-2007/142167 | 12/2007 |
| WO | WO-20071148601 | 12/2007 |
| WO | WO-2008/117810 | 10/2008 |
| WO | WO-2008/126879 | 10/2008 |
| WO | WO-2008/126884 | 10/2008 |
| WO | WO-2009/093722 | 7/2009 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:the "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTS for Flat Panel Displays", AM-FPD '08 Digest of Technical Papers, Jul. 2, 2008, pp. 251-252, The Japan Society of Applied Physics.

Godo.H et al., "Temperature Dependence of Characteristics and Electronic Structure for Amorphous In—Ga—Zn—Oxide FTF", AM-FPD '09 Digest of Technical Papers, Jul. 1, 2009, pp. 41-44.

(56) References Cited

OTHER PUBLICATIONS

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 28, pp. 1830-1833.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hsieh.H et al., "P-29:Modeling of Amorphous Oxide Semiconductor Thin Film Transistors and Subgap Density of States", SID Digest '09 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Oxygen Vacancies in ZnO", Appl. Phys. Lett. (Applied Physics Letters), 2005, vol. 87, pp. 122102-1-122102-3.

Janotti.A et al., "Native Point Defects in ZnO", Phys. Rev. B (Physical Review. B), Oct. 4, 2007, vol. 76, No. 16, pp. 165202-1-165202-22.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Paper, May 31, 2009, pp. 983-985.

Kanno.H et al., "White Stacked Electrophosphorecent Organic Light-Emitting Devices Employing Moo3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Applications", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$—$ZnGa_2O_4$—ZnO System", Journal of Solid State Chemisry, Apr. 1, 1995, vol. 116, No. 1, pp. 170-178.

Kimizuka.N et al., "Spinel,$YbFe_2O_4$, and $Yb_2Fe_3O_7$ Types of Structures for Compounds in the $In_2O_3$ and $Sc_2O_3$—$A_2O_3$—Bo Systems [A; Fe, Ga, or Al; B: Mg, Mn, Fe, Ni, Cu,or Zn] at Temperatures over 1000° C.", Journal of Solid State Chemisry, 1985, vol. 60, pp. 382-384.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2009, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nowatari.H et al., "60.2: Intermediate Connector With Suppressed Voltage Loss for White Tandem OLEDs", SID Digest '09 : SID International Sysmpsium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Sysmpsium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

(56) References Cited

OTHER PUBLICATIONS

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2010/070517) Dated Feb. 8, 2011.

Written Opinion (Application No. PCT/JP2010/070517) Dated Feb. 8, 2011.

Nakamura.M et al., "Syntheses and crystal structures of new homologous compounds, indium iron zinc oxides (InFeO3(ZnO)m (m natural number) and related compounds", Kotai Butsuri (Solid State Physics), 1993, vol. 28, No. 5, pp. 317-327.

Pending Claims (U.S. Appl. No. 12/894,911) Dated March 26, 2013.

Korean Office Action (Application No. 2014-7002547) Dated Apr. 24, 2014.

Korean Office Action (Application No. 2014-7002547) Dated Aug. 20, 2014.

Chinese Office Action (Application No. 201080054910.8) Dated Mar. 16, 2015.

Taiwanese Office Action (Application No. 099140829) Dated Apr. 24, 2015.

\* cited by examiner

DISPLAY DEVICE

CROSS-REFERENCE TO RELATED APPLICATIONS

This application is a continuation of U.S. application Ser. No. 14/154,534, filed Jan. 14, 2014, now allowed, which is a continuation of U.S. application Ser. No. 13/594,934, filed Aug. 27, 2012, now U.S. Pat. No. 8,637,863, which is a continuation of U.S. application Ser. No. 12/959,989, filed Dec. 3, 2010, now U.S. Pat. No. 8,269,218, which claims the benefit of a foreign priority application filed in Japan as Serial No. 2009-276454 on Dec. 4, 2009, all of which are incorporated by reference.

TECHNICAL FIELD

The present invention relates to a display device having a transistor, and the channel of the transistor includes an oxide semiconductor film.

BACKGROUND ART

Patent Document 1 discloses a thin film transistor in which a first gate electrode is formed on a substrate, a first gate insulating layer is formed so as to cover the first gate electrode, a semiconductor layer formed using an oxide semiconductor is formed over the first gate insulating layer, a second gate insulating layer is formed over the semiconductor layer, a second gate electrode is formed over the second gate insulating layer, and a drain electrode and a source electrode which are connected to the semiconductor layer are formed, wherein the thickness of the second gate electrode is equal to or larger than that of the first gate electrode is described (Claim 1). In Patent Document 1, the above-described thin film transistor can be used for a driving field-effect transistor of a liquid crystal display or an organic EL display (144th paragraph).

REFERENCE

[Patent Document 1] Japanese Published Patent Application No. 2009-176865

DISCLOSURE OF INVENTION

In Patent Document 1, the generation of a hump of conduction property of a thin film transistor can be suppressed (26th paragraph).

However, the above-described structure is insufficient in order to improve characteristics of a transistor. In view of the above, it is an object of an embodiment of the present invention to provide a thin film transistor including an oxide semiconductor film, which is used for the pixel portion of a display device such as a liquid crystal display or an organic EL display and has high reliability.

In the following experiment, the influence of hydrogen on a transistor including an oxide semiconductor film was examined. Thus, the inventor found that characteristics of the transistor can be improved by removing hydrogen and the above problem can be solved.

<Experiment. Hydrogen and Transistor Characteristics>

FIGS. 1A and 1B show schematic diagrams of experimental transistors including oxide semiconductor films (amorphous In—Ga—Zn—O films, in this experiment, also referred to as a-IGZO) and characteristics of the transistors. FIG. 1A shows the case where $SiO_x$ formed by a plasma CVD method (also referred to as PECVD-$SiO_x$) is used for an interlayer film and FIG. 1B shows the case where $SiO_x$ formed by a sputtering method (also referred to as sputtered-$SiO_x$ or sputtering-$SiO_x$) is used for the interlayer film. The manufacturing method other than the above is the same in each of the transistors. When $SiO_x$ formed by a plasma CVD method was used, normally-on transistor characteristics were obtained. In addition, the change in transistor characteristics depending on the measurement temperature was large. On the other hand, when $SiO_x$ formed by a sputtering method was used, normally-off transistor characteristics were obtained and the change in transistor characteristics depending on the measurement temperature was small. When the hydrogen concentration of each of these two transistors was measured by secondary ion mass spectrometry, it was found that the transistor in which $SiO_x$ formed by a plasma CVD method is used includes a large amount of hydrogen; however, the transistor in which $SiO_x$ formed by a sputtering method is used includes a small amount of hydrogen (FIG. 2).

Further, in order to clarify electronic characteristics of a-IGZO, analysis thereof was conducted by first principle calculation. (A) a-IGZO satisfying the stoichiometric proportion was and (B) a-IGZO to which hydrogen was added were assumed, and the electronic states were calculated. A unit cell of 84 atoms, the composition ratio of In:Ga:Zn:O=1:1:1:4, and the density of 5.9 g/cm$^3$ was assumed, and an amorphous structure was reproduced by the classical molecular dynamics method, and further, optimization of the structure was performed by the quantum molecular dynamic method. Then, the electronic states were calculated.

The calculation results are shown in FIGS. 3A and 3B. FIGS. 3A and 3B show DOS (Density Of States, the electron density of states) of a-IGZO. The point where Energy shows 0 (zero) is the Fermi level. It is found that, in (A) a-IGZO satisfying the stoichiometric proportion, the Fermi level exists in the valence band; however, in (B) a-IGZO to which hydrogen is added, electrons exist also in the conduction band. That is, it is found that, in a-IGZO, hydrogen forms a donor level and supplies electrons.

Removing hydrogen is removing a donor in the oxide semiconductor film. The oxide semiconductor film can be a semiconductor which is made intrinsic or substantially intrinsic by removing the donor.

When the off-state current of the transistor (the channel length (L)=10.0 μm, the channel width (W)=1 m) whose channel has the oxide semiconductor film with reduced hydrogen concentration was measured at room temperature (25° C.), the off-state current was equal to or lower than $1 \times 10^{-12}$ A (FIG. 4). When W is converted into 1 μm, the off-state current is equal to or lower than $1 \times 10^{-18}$ A.

The oxide semiconductor film can be a semiconductor which is made intrinsic or substantially intrinsic by minimizing the number of hydrogen atoms contained in the oxide semiconductor film. Accordingly, characteristics of the transistor can be improved and the above problem can be solved.

An embodiment of the present invention is a display device having a first gate electrode; a first gate insulating film over the first gate electrode; an oxide semiconductor film over the first gate insulating film; a source electrode and a drain electrode over the oxide semiconductor film, and wherein the source electrode and the drain electrode are electrically connected to the oxide semiconductor film; a second gate insulating film over the source electrode, the drain electrode, and the oxide semiconductor film; a second gate electrode over the second gate insulating film, and wherein the second gate electrode is electrically connected to the first gate electrode; an organic resin film having flatness over the second gate insulating film; a pixel electrode over the organic resin film having flatness, and wherein the pixel electrode is electrically connected to either the source electrode or the drain electrode; a first alignment film over and in contact with the second gate electrode and the pixel electrode; a liquid crystal layer over the first alignment film; a second alignment film over the liquid crystal layer; a counter electrode over the second alignment film; and a counter substrate over the counter electrode, wherein the concentration of hydrogen atoms contained in the oxide semiconductor film and measured by secondary ion mass spectrometry is less than $1\times10^{16}$ $cm^{-3}$.

An embodiment of the present invention is a display device having a first gate electrode; a first gate insulating film over the first gate electrode; an oxide semiconductor film over the first gate insulating film; a source electrode and a drain electrode over the oxide semiconductor film, and wherein the source electrode and the drain electrode are electrically connected to the oxide semiconductor film; a second gate insulating film over the source electrode, the drain electrode and the oxide semiconductor film; a second gate electrode over the second gate insulating film, and wherein the second gate electrode is electrically connected to the first gate electrode; an organic resin film having flatness over the second gate insulating film; a pixel electrode over the organic resin film having flatness, and wherein the pixel electrode is electrically connected to either the source electrode or the drain electrode; an EL layer over the pixel electrode; a counter electrode over the EL layer; a sealing material over and in contact with the second gate electrode and the counter electrode; and a counter substrate over the sealing material, wherein the concentration of hydrogen atoms contained in the oxide semiconductor film and measured by secondary ion mass spectrometry is less than $1\times10^{16}$ $cm^{-3}$.

An embodiment of the present invention is a display device having a first gate electrode; a first gate insulating film over the first gate electrode; an oxide semiconductor film over the first gate insulating film; a source electrode and a drain electrode over the oxide semiconductor film, and wherein the source electrode and the drain electrode are electrically connected to the oxide semiconductor film; a second gate insulating film over the source electrode, the drain electrode and the oxide semiconductor film; a second gate electrode over the second gate insulating film, and wherein the second gate electrode is electrically connected to the first gate electrode; an organic resin film having flatness over the second gate insulating film; a pixel electrode over the organic resin film having flatness, and wherein the pixel electrode is electrically connected to either the source electrode or the drain electrode; and a filler over and in contact with the second gate electrode and the pixel electrode, wherein a spherical particle including a cavity is provided in the filler, the cavity contains a black region and a white region, and a space around the cavity is filled with a liquid, wherein the concentration of hydrogen atoms contained in the oxide semiconductor film and measured by secondary ion mass spectrometry is less than $1\times10^{16}$ $cm^{-3}$.

An embodiment of the present invention is a display device having a first gate electrode; a first gate insulating film over the first gate electrode; an oxide semiconductor film over the first gate insulating film; a source electrode and a drain electrode over the oxide semiconductor film, and wherein the source electrode and the drain electrode are electrically connected to the oxide semiconductor film; a second gate insulating film over the source electrode, the drain electrode and the oxide semiconductor film; a second gate electrode over the second gate insulating film, and wherein the second gate electrode is electrically connected to the first gate electrode; an organic resin film having flatness over the second gate insulating film; a pixel electrode over the organic resin film having flatness, and wherein the pixel electrode is electrically connected to either the source electrode or the drain electrode; and an electronic ink layer over and in contact with the second gate electrode and the pixel electrode, wherein a microcapsule in which positively charged white microparticles and negatively charged black microparticles are encapsulated is provided in the electronic ink layer, wherein the concentration of hydrogen atoms contained in the oxide semiconductor film and measured by secondary ion mass spectrometry is less than $1\times10^{16}$ $cm^{-3}$.

According to an embodiment of the present invention, the concentration of hydrogen atoms measured by secondary ion mass spectrometry of the oxide semiconductor film in which a channel formed is less than $1\times10^{16}$ $cm^{-3}$. Accordingly, the oxide semiconductor film is a semiconductor which is made intrinsic or substantially intrinsic. The carrier density of the oxide semiconductor film is extremely reduced. The off-state current of the transistor is extremely decreased. Further, avalanche breakdown is not easily generated.

Furthermore, as Patent document regarding the concentration of hydrogen atoms, Japanese Published Patent Application No. 2007-103918 is given. In Japanese Published Patent Application No. 2007-103918, a field-effect transistor having a channel layer formed of an amorphous oxide film including In or Zn, wherein the amorphous oxide film includes hydrogen atoms or deuterium atoms of equal to or greater than $10^{16}$ $cm^{-3}$ and equal to or less than $10^{20}$ $cm^{-3}$, is described. However, hydrogen atoms are positively added, which is a technical idea of the above document. On the other hand, the number of hydrogen atoms is minimized, which is a technical idea of an embodiment of the present invention. Therefore, these technical ideas are opposite and completely different from each other. According to an embodiment of the present invention, the concentration of hydrogen atoms contained in the oxide semiconductor film is less than $1\times10^{16}$ $cm^{-3}$, whereby the oxide semiconductor film can be a semiconductor which is made intrinsic or substantially intrinsic. Moreover, the density of the carriers can be extremely reduced, and the off-state current of the transistor can be extremely decreased.

According to an embodiment of the present invention, the transistor which is electrically connected to the pixel electrode is not covered with the organic resin film having flatness and the pixel electrode. Hydrogen atoms of the organic resin film do not adversely affect the transistor. The potential applied to the pixel electrode does not adversely affect the transistor.

According to an embodiment of the present invention, the second gate insulating film is formed over the source electrode and the drain electrode. Therefore, the source electrode and the drain electrode are protected by the second gate insulating film.

BEST MODE FOR CARRYING OUT THE INVENTION

Figure 1A:
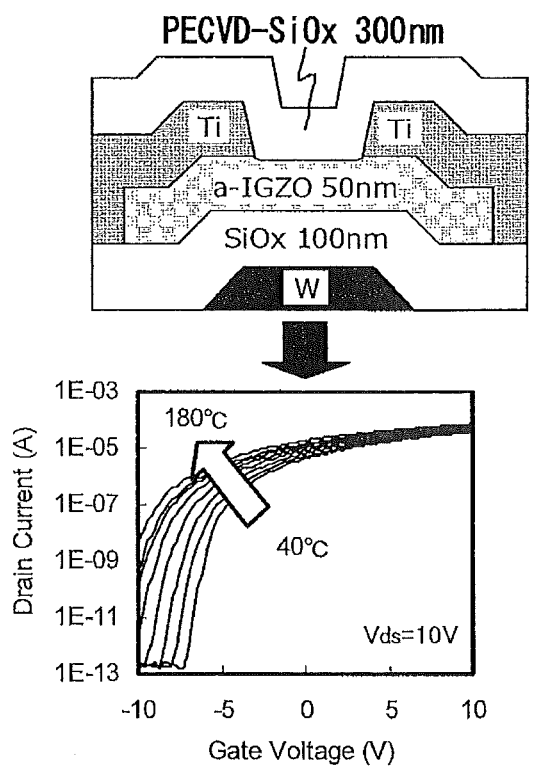
FIGS. 1A and 1B are schematic diagrams of transistors and diagrams showing characteristics thereof.
Figure 1B:
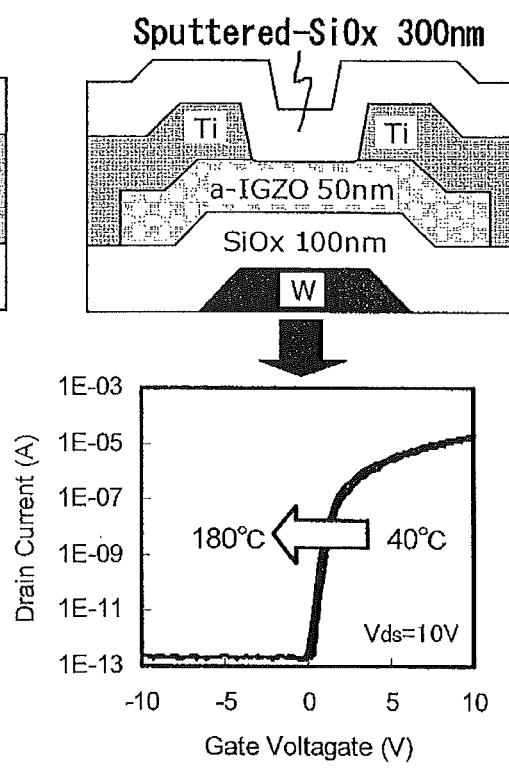
Figure 2:
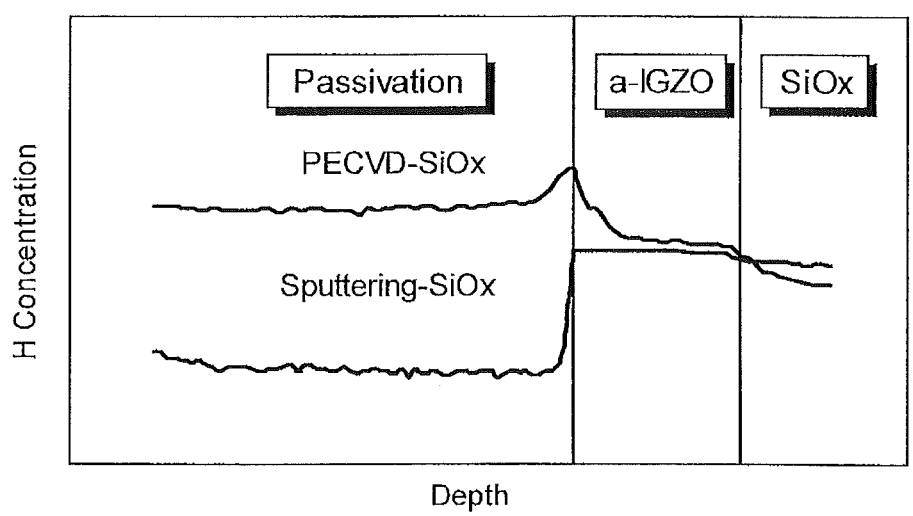
FIG. 2 shows a hydrogen concentration profile of a transistor.
Figure 3A:
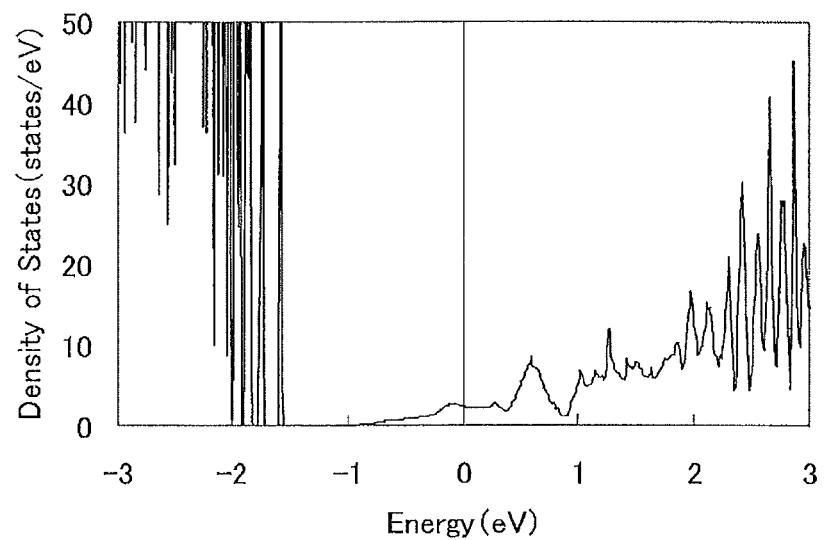
FIGS. 3A and 3B show calculation results.
Figure 3B:
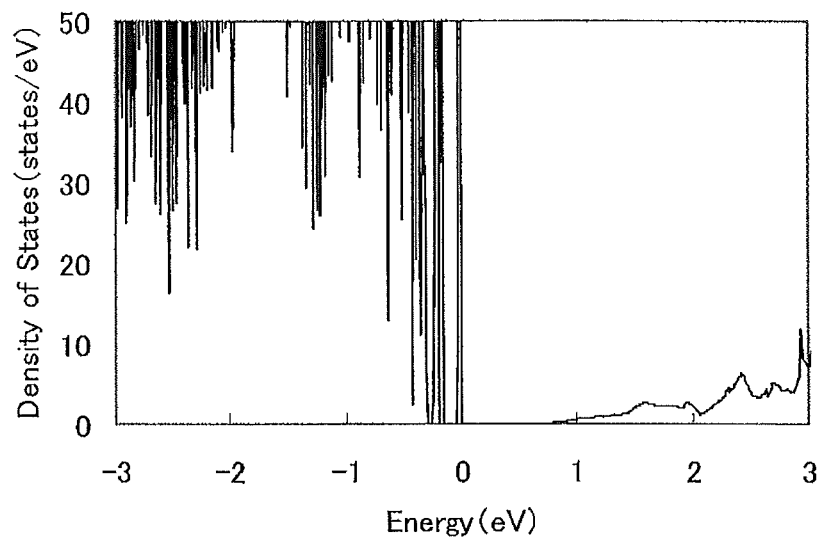
Figure 4:
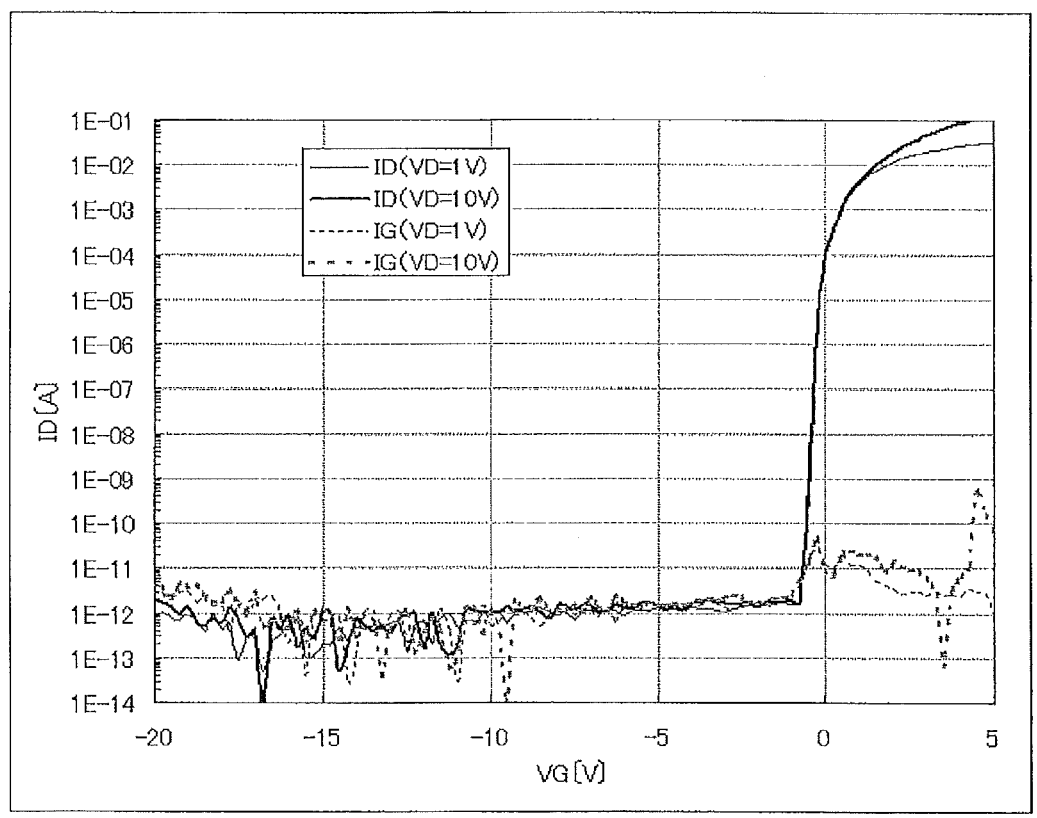
FIG. 4 shows transistor characteristics.

Embodiments of the present invention will be described below. However, the present invention can be carried out in many different modes, and it is easily understood by those skilled in the art that modes and details of the present invention can be modified in various ways without departing from the purpose and the scope of the present invention. Therefore, the present invention is not construed as being limited to description of the embodiment. Note that the same reference numerals are commonly given to the same portions or portions having similar functions in different drawings, and repetitive explanation will be omitted in some cases.

Embodiment 1

This embodiment discloses a display device including a first gate electrode; a first gate insulating film formed over the first gate electrode; an oxide semiconductor film formed over the first gate insulating film; and a source electrode and a drain electrode formed over the oxide semiconductor film. The source electrode and the drain electrode are electrically connected to the oxide semiconductor film. A second gate insulating film formed over the source electrode, the drain electrode, and the oxide semiconductor film; and a second gate electrode formed over the second gate insulating film are provided. The second gate electrode is electrically connected to the first gate electrode. An organic resin film having flatness formed over the second gate insulating film and a pixel electrode formed over the organic resin film having flatness are provided. The pixel electrode is electrically connected to either the source electrode or the drain electrode, and a display medium formed over and in contact with the second gate electrode and the pixel electrode.

Figure 5A:
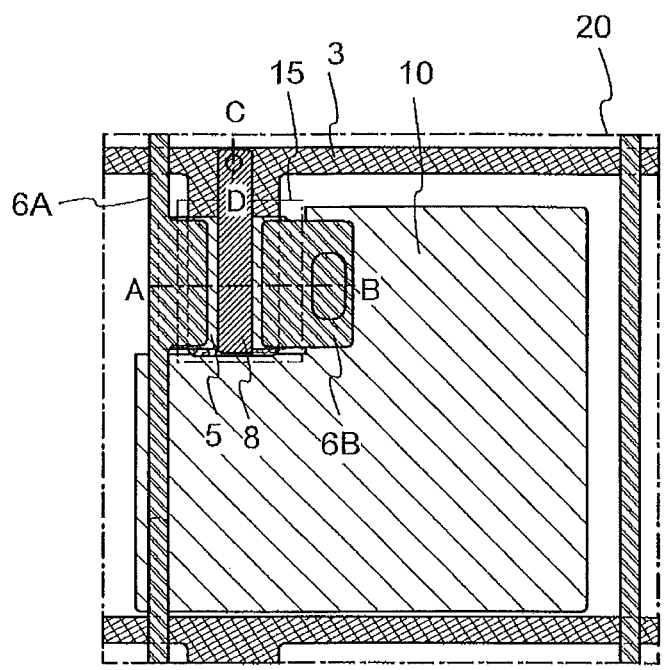
FIGS. 5A and 5B illustrate a display device.
Figure 5B:
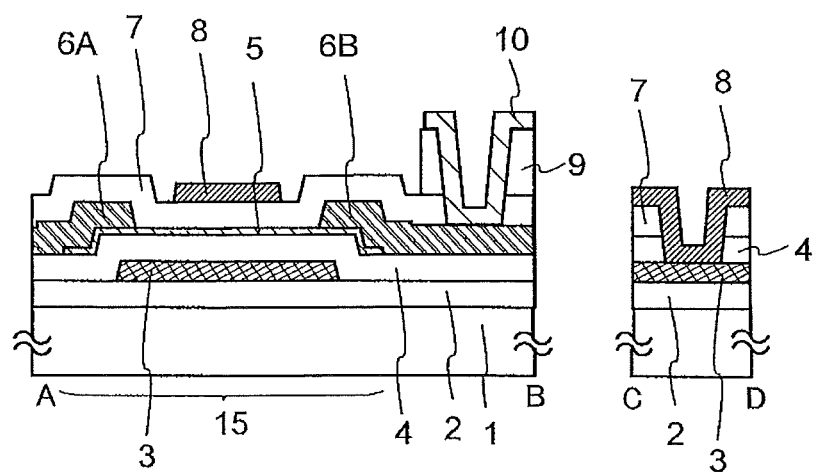

As illustrated in FIGS. 5A and 5B, the display device includes a pixel 20. The display device may include a plurality of pixels 20. The pixel 20 includes a transistor 15. The transistor 15 includes a first gate electrode 3, a first gate insulating film 4, an oxide semiconductor film 5, an electrode 6A (one of a source electrode and a drain electrode), an electrode 6B (the other of the source electrode and the drain electrode), a second gate insulating film 7, and a second gate electrode 8. The pixel 20 includes an organic resin film 9 having flatness and a pixel electrode 10. FIG. 5A is a top view of the pixel 20 and FIG. 5B illustrates a cross section A-B and a cross section C-D in FIG. 5A.

The transistor 15 is formed over a substrate 1. An insulating film 2 serving as a base film is formed over the substrate 1. The first gate electrode 3 is formed over the insulating film 2. The first gate insulating film 4 is formed over the first gate electrode 3 to cover the first gate electrode 3. The oxide semiconductor film 5 is formed over the first gate insulating film 4. The electrode 6A and the electrode 6B are formed over the oxide semiconductor film 5. The second gate insulating film 7 is formed over the electrode 6A, the electrode 6B, and the oxide semiconductor film 5. The second gate insulating film 7 covers the electrode 6A, the electrode 6B, and the oxide semiconductor film 5. The second gate electrode 8 is formed over the second gate insulating film 7.

Figure 6A:
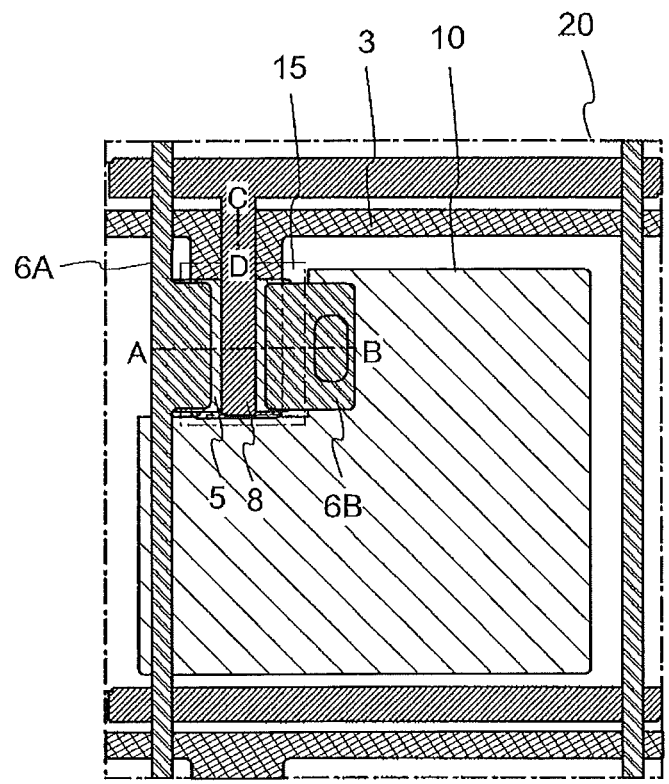
FIGS. 6A and 6B illustrate a display device.
Figure 6B:
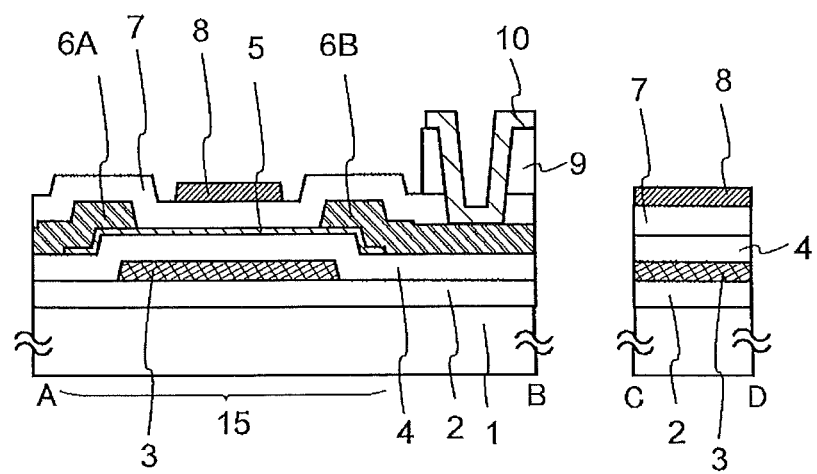

In FIG. 5A, the second gate electrode 8 is electrically connected to the first gate electrode 3; however, the second gate electrode 8 is not necessarily to be electrically connected to the first gate electrode 3 (FIGS. 6A and 6B). When the second gate electrode 8 is electrically connected to the first gate electrode 3, the second gate electrode 8 has the same potential as the first gate electrode 3. On the other hand, when the second gate electrode 8 is not electrically connected to the first gate electrode 3, the second gate electrode 8 does not always have the same potential as the first gate electrode 3.

The first gate electrode 3 is electrically connected to a scan line driver circuit (not shown). A selection signal from the scan line driver circuit is applied to the first gate electrode 3. When the first gate electrode 3 is electrically connected to the second gate electrode 8, the same selection signal is also applied to the second gate electrode 8. When the first gate electrode 3 is not electrically connected to the second gate electrode 8, the second gate electrode 8 is electrically connected to another scan line driver circuit and another selection signal from the scan line driver circuit is applied thereto.

The electrode 6A is electrically connected to a signal line driver circuit (not shown). An image signal from the signal line driver circuit is applied to the electrode 6A.

The organic resin film 9 having flatness is formed over the second gate insulating film 7. The organic resin film 9 is not formed over the second gate electrode 8. The pixel electrode 10 is formed over the organic resin film 9. A display medium is formed over the second gate electrode 8, the second gate insulating film 7, and the pixel electrode 10 (FIGS. 14A, 14B, 15A, 15B, 16A, 16B, 22A and 22B).

A storage capacitor is not provided for a display device in this embodiment. Since the off-state current of the transistor 15 is extremely low, the potentials which are applied to the electrode 6B and the pixel electrode 10 are held without decreasing. Therefore, a storage capacitor is not needed. However, it is needless to say that a storage capacitor may be provided.

Figure 7:
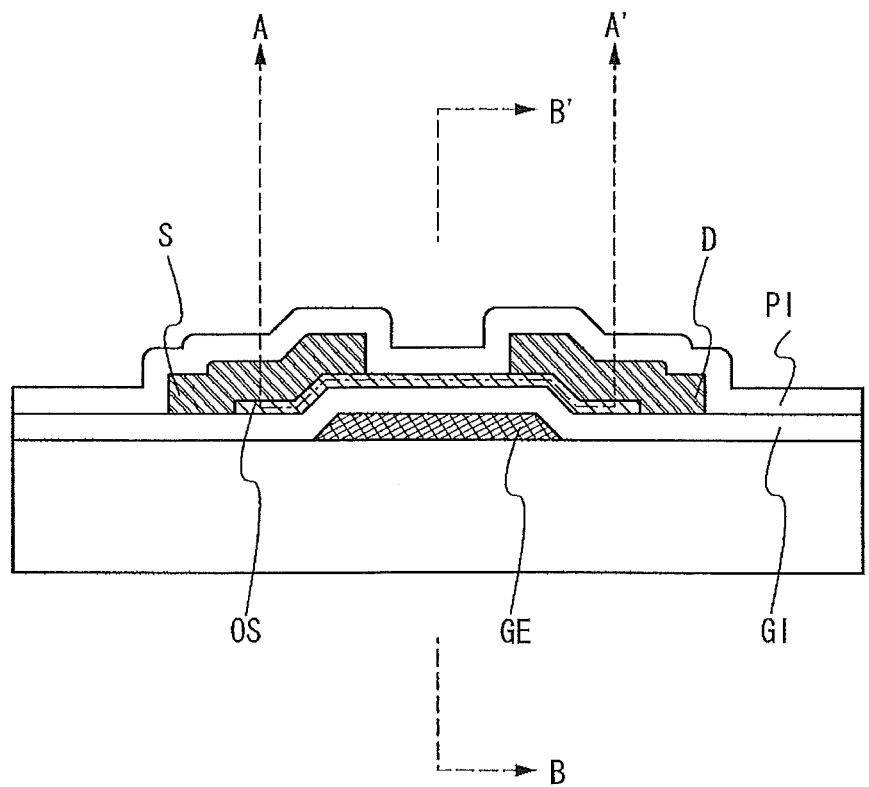
FIG. 7 is a cross sectional view of a transistor.

The first gate insulating film 4 and the second gate insulating film 7 may be in contact with each other in a region where neither the electrode 6A nor the electrode 6B is formed (FIGS. 5B, 6B, and 7). When the first gate insulating film 4 and the second gate insulating film 7 are in contact with each other, the oxide semiconductor film 5 is covered with the first gate insulating film 4 and the second gate insulating film 7, whereby impurities can be prevented from entering the oxide semiconductor film 5.

Features of a display device are described below. The concentration of hydrogen atoms contained in the oxide semiconductor film 5 in which a channel is formed is less than $1 \times 10^{16}$ cm$^{-3}$. Therefore, the oxide semiconductor film 5 is a semiconductor which is intrinsic or substantially intrinsic. Descriptions thereof will be made later.

The electrode 6A and the electrode 6B are covered with the second gate insulating film 7. The electrode 6A and the electrode 6B are protected by the second gate insulating film 7.

As illustrated in FIG. 5B and FIG. 6B, the organic resin film 9 and the pixel electrode 10 are not formed over the transistor 15. Hydrogen atoms contained in the organic resin film 9 do not affect the transistor 15. The potential which is applied to the pixel electrode 10 does not affect the transistor 15.

Next, each component of the display device is described below.

First, the oxide semiconductor film 5 is described. A channel is formed in the oxide semiconductor film 5. The oxide semiconductor film 5 may be formed to have a thickness of 2 nm to 200 nm.

(Composition)

As a material of the oxide semiconductor film 5, any of the following oxide semiconductors can be used: a four-component metal oxide such as In—Sn—Ga—Zn—O; a three-component metal oxide such as In—Ga—Zn—O, In—Sn—Zn—O, In—Al—Zn—O, Sn—Ga—Zn—O, Al—Ga—Zn—O, or Sn—Al—Zn—O; a two-component metal oxide such as In—Zn—O, Sn—Zn—O, Al—Zn—O, Zn—Mg—O, Sn—Mg—O, or In—Mg—O; In—O, Sn—O, Zn—O, or the like. Further, SiO$_2$ may be contained in the above oxide semiconductor.

As the oxide semiconductor film 5, a thin film expressed by InMO$_3$ (ZnO)$_m$ (m>0) can be used. Here, M represents one or more metal elements selected from Ga, Al, Mn, and Co. For example, M can be Ga, Ga and Al, Ga and Mn, Ga and Co, or the like. Among the oxide semiconductor film 5 expressed by InMO$_3$ (ZnO)$_m$ (m>0), an oxide semiconductor which includes Ga as M is referred to as an In—Ga—Zn—O oxide semiconductor, and a thin film of the In—Ga—Zn—O oxide semiconductor is also referred to as an In—Ga—Zn—O film.

(Hydrogen Concentration)

The hydrogen concentration of the oxide semiconductor film 5 measured by secondary ion mass spectrometry is less than $1 \times 10^{16}$ cm$^{-3}$, preferably less than $1 \times 10^{14}$ cm$^{-3}$. As described above, the oxide semiconductor 5 with reduced hydrogen concentration is a semiconductor which is made intrinsic or substantially intrinsic. Further, it is preferable that the oxide semiconductor 5 does not include an impurity element forming a donor level or an acceptor level.

It is known that it is difficult to obtain data in the proximity of a surface of a sample or in the proximity of an interface between stacked films formed using different materials by secondary ion mass spectrometry analysis in principle. Thus, in the case where distribution of the hydrogen concentration of a film in thickness direction is analyzed by secondary ion mass spectrometry, an average value in a region where the film is provided, the value is not greatly changed, and almost the same intensity can be obtained is employed as the hydrogen concentration. Further, in the case where the thickness of the film is small, a region where almost the same intensity can be obtained cannot be found in some cases due to the influence of the hydrogen concentration of the film adjacent thereto. In this case, the maximum value or the minimum value of the hydrogen concentration of a region where the film is provided is employed as the hydrogen concentration of the film. Furthermore, in the case where a mountain-shaped peak having the maximum value and/or a valley-shaped peak having the minimum value do/does not exist in the region where the film is provided, the value of the inflection point is employed as the hydrogen concentration.

The number of hydrogen atoms contained in the oxide semiconductor film 5 is preferably zero. The concentration of hydrogen atoms is equal to or greater than 0 cm$^{-3}$ and less than $1 \times 10^{16}$ cm$^{-3}$. However, it is difficult to detect that the number of hydrogen atoms is zero by secondary ion mass spectrometry. Therefore, it is preferable that the concentration of hydrogen atoms is at least equal to or less than the detection limit of secondary ion mass spectrometry.

(Carrier Density)

The carrier density of the oxide semiconductor film 5 having the concentration of hydrogen atoms as described above is less than $1 \times 10^{12}$ cm$^{-3}$ at 300 K. The carrier density of the oxide semiconductor film 5 may be less than $1 \times 10^{12}$ cm$^{-3}$ at 300 K. It is preferable that the carrier density of the oxide semiconductor film 5 is less than $1 \times 10^{10}$ cm$^{-3}$ at 300 K. The carrier density can be estimated by the Hall measurement, or the like. The measuring method used here is described in Examples.

Here, the intrinsic carrier density of an oxide semiconductor is described. The intrinsic carrier density refers to the carrier density of an intrinsic semiconductor.

The intrinsic carrier density contained in a semiconductor, $n_i$, can be obtained by approximating Fermi-Dirac distribution according to Fermi-Dirac statistics with the formula of Boltzmann distribution (see Formula 1).

$$n_i = \sqrt{N_C N_V} \exp\left(-\frac{E_g}{2kT}\right) \quad \text{[FORMULA 1]}$$

The intrinsic carrier density, $n_i$, can be obtained by the approximation formula is a relational expression of density of an effective state at a conduction band, $N_c$, density of an effective state at a valence band, $N_v$, and a band gap, $E_g$. According to the above Formula, the intrinsic carrier density, $n_i$, of silicon is $1.4 \times 10^{10}$ cm$^{-3}$ and the intrinsic carrier density, $n_i$, of an oxide semiconductor (here, In—Ga—Zn—O film) is $1.2 \times 10^{-7}$ cm$^{-3}$. It is found that the intrinsic carrier density of the oxide semiconductor is extremely lower than that of silicon.

The carrier density of the oxide semiconductor film 5 having the concentration of hydrogen atoms as described above is extremely low and the off-state current of the transistor 15 including the oxide semiconductor film 5 is extremely low.

Next, structures other than the oxide semiconductor film 5 are described.

The substrate 1 has enough heat resistance to withstand heat treatment to be performed later. As the substrate 1, a glass substrate of barium borosilicate glass, aluminoborosilicate glass, or the like is used. Alternatively, a substrate formed of an insulator, such as a ceramic substrate, a quartz substrate, a sapphire substrate, or a crystallized glass substrate may be used as the substrate 1. Further alternatively, a plastic film or the like formed using polyethylene terephthalate, polyimide, an acrylic resin, polycarbonate, polypropylene, polyester, polyvinyl chloride, or the like can be used as long as it has heat resistance high enough to withstand heat treatment to be performed later.

For the insulating film 2, a silicon oxide film, a silicon nitride film, a silicon oxynitride film, or the like is used. It is preferable that substances including hydrogen atoms such as hydrogen, hydroxyl, or moisture are not contained in the insulating film 2. The insulating film 2 may be formed to have a thickness of 10 nm to 200 nm. The insulating film 2 prevents impurities contained in the substrate 1 from entering the first gate insulating film 4 and the oxide semiconductor film 5. Note that the insulating film 2 is not necessarily to be formed if it is not necessary to consider impurities contained in the substrate 1.

The first gate electrode 3 is formed in a single layer or a stacked layer using a metal material such as molybdenum, titanium, chromium, tantalum, tungsten, aluminum, copper, neodymium, or scandium, or an alloy material which includes any of these materials as a main component. It is preferable that substances including hydrogen atoms such as hydrogen, hydroxyl, or moisture are not contained in the first gate electrode 3. The first gate electrode 3 may be formed to have a thickness of 10 nm to 200 nm.

The first gate insulating film 4 is formed in a single layer or a stacked layer using a silicon oxide film, a silicon nitride film, a silicon oxynitride film, a silicon nitride oxide film, an aluminum oxide film, a hafnium silicate (HfSiO$_x$) film, a HfSi$_x$O$_y$ film to which N is added, a hafnium aluminate (HfAlO$_x$) film to which nitrogen is added, a hafnium oxide film, and/or an yttrium oxide film. By using a high-k material such as a hafnium silicate (HfSiO$_x$) film, a HfSi$_x$O$_y$ film to which N is added, a hafnium aluminate (HfAlO$_x$) film to which nitrogen is added, a hafnium oxide film, or an yttrium oxide film, gate leakage can be reduced. It is preferable that substances including hydrogen atoms such as hydrogen, hydroxyl, or moisture are not contained in the first gate insulating film 4. The first gate insulating film 4 may be formed to have a thickness of 10 nm to 500 nm.

A halogen element such as fluorine or chlorine may be contained in the first gate insulating film 4 at a concentration of about $5\times10^{18}$ cm$^{-3}$ to $1\times10^{20}$ cm$^{-3}$. Substances including hydrogen atoms such as hydrogen, moisture, hydroxyl, or hydride which may be contained in the oxide semiconductor film 5 or the interface between the first gate insulating film 4 and the oxide semiconductor film 5 can be removed by such a halogen element. When as the first gate insulating film 4, for example, a stacked layer of a silicon nitride film and a silicon oxide film is formed, it is preferable that the silicon oxide film contain a halogen element at the above concentration and is disposed on the side in contact with the oxide semiconductor film 5. The silicon nitride film prevents impurities such as hydrogen, moisture, hydroxyl, or hydride (also referred to as a hydrogen compound) from entering the silicon oxide film.

The electrode 6A (one of a source electrode and a drain electrode) and the electrode 6B (the other of the source electrode and the drain electrode) are formed in a single layer or a stacked layer using a metal material such as molybdenum, titanium, chromium, tantalum, tungsten, aluminum, copper, neodymium, scandium, or yttrium; an alloy material which includes any of these materials as a main component; a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is preferable that hydrogen, hydroxyl, or moisture is not contained in the electrode 6A and the electrode 6B. The electrode 6A and the electrode 6B may be formed to have thicknesses of 10 nm to 500 nm.

The second gate insulating film 7 can be formed using the same material as the first gate insulating film 4. For example, a silicon oxide film is used. It is preferable that hydrogen, hydroxyl, or moisture is not contained in the second gate insulating film 7. The second gate insulating film 7 may be formed to have a thickness of 10 nm to 200 nm. Note that a silicon oxynitride film, an aluminum oxide film, an aluminum oxynitride film, or the like can be used instead of the silicon oxide film.

Further, the second gate insulating film 7 may include a defect. The defect can capture hydrogen atoms contained in the oxide semiconductor film 5. Thus, the number of hydrogen atoms contained in the oxide semiconductor film 5 can be further reduced.

Halogen elements such as fluorine or chlorine may be contained in the second gate insulating film 7 at a concentration of about $5\times10^{18}$ cm$^{-3}$ to $1\times10^{20}$ cm$^{-3}$. Impurities such as hydrogen, moisture, hydroxyl, or hydride which may be contained in the oxide semiconductor film 5 or at the interface between the second gate insulating film 7 and the oxide semiconductor film 5 can be removed by such a halogen element.

The second gate electrode 8 is formed as a single layer or a stacked layer using a metal material such as molybdenum, titanium, chromium, tantalum, tungsten, aluminum, copper, neodymium, or scandium or an alloy material which contains any of these materials as a main component. It is preferable that substances including hydrogen atoms such as hydrogen, hydroxyl, or moisture are not contained in the second gate electrode 8. The second gate electrode 8 may be formed to have a thickness of 10 nm to 200 nm. The second gate electrode 8 may be formed to be thicker than the first gate electrode 3. The second gate electrode 8 may be formed using the same material as the first gate electrode 3.

The organic resin film 9 is formed using an acrylic resin film having flatness, a polyimide resin film having flatness, or the like. The organic resin film 9 may be formed to have a thickness of 1.0 μm to 2.0 μm.

For the pixel electrode 10, typically, a conductive material having reflectance or light-blocking properties, such as a single material formed using an element selected from aluminum, copper, titanium, tantalum, tungsten, molybdenum, chromium, neodymium, or scandium; an alloy containing any of these elements; a compound (e.g., an oxide or a nitride) containing any of these elements; or the like can be used. Alternatively, as the conductive material having a light-transmitting property, a conductive material having a light-transmitting property, such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added, can be used. A stacked structure containing any of these materials can also be used. The pixel electrode 10 may be formed to have a thickness of 50 nm to 500 nm.

Next, the operation of the transistor 15 having the oxide semiconductor film 5 will be described with reference to energy band diagrams.

FIG. 7 is a cross-sectional view of a common inverted staggered thin film transistor using an oxide semiconductor film. An oxide semiconductor film (OS) is formed over a gate electrode (GE) with a first gate insulating film (GI) interposed therebetween. A source electrode (S) and a drain electrode (D) are formed over the oxide semiconductor film and the first gate insulating film. A passivation film (PI) is formed over the source electrode and the drain electrode. In a region where neither the source electrode nor the drain electrode is not formed, the first gate insulating film and the passivation film are in contact with each other.

Figure 8A:
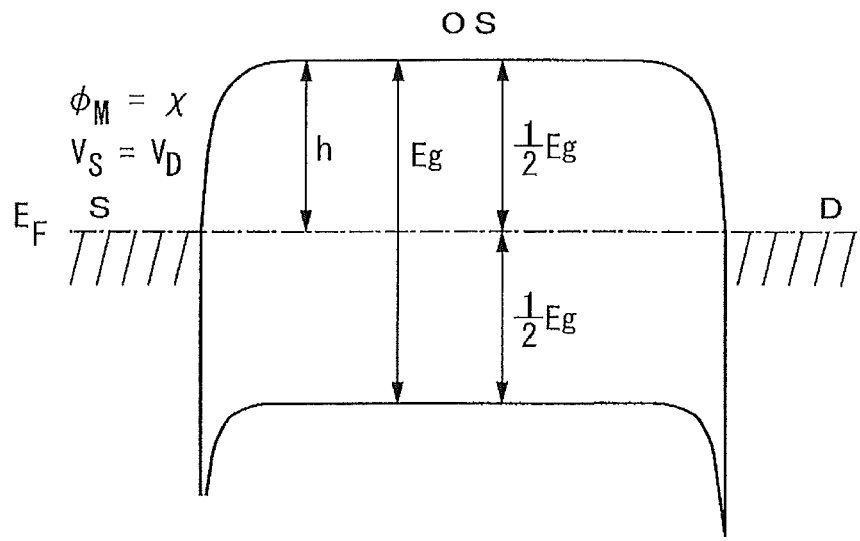
FIGS. 8A and 8B are energy band diagrams of a transistor.
Figure 8B:
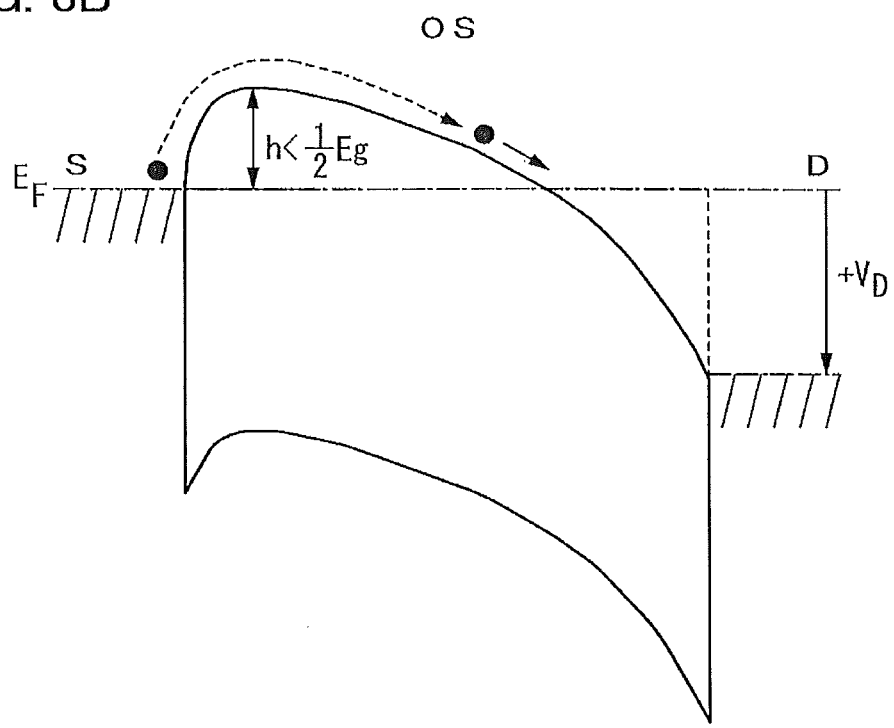

FIGS. 8A and 8B are energy band diagrams (schematic diagrams) of a cross-section taken along line A-A' in FIG. 7. FIG. 8A illustrates the case where the potential of a voltage applied to the source is equal to the potential of a voltage applied to the drain (VD=0 V), and FIG. 8B illustrates the case where a positive potential is applied to the drain (VD>0) with respect to the source.

Figure 9A:
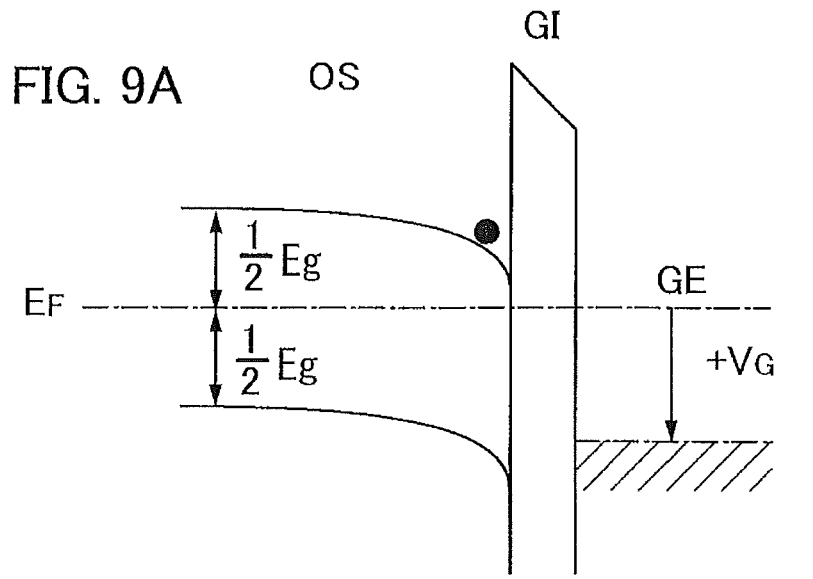
FIGS. 9A and 9B are energy band diagrams of a transistor.
Figure 9B:
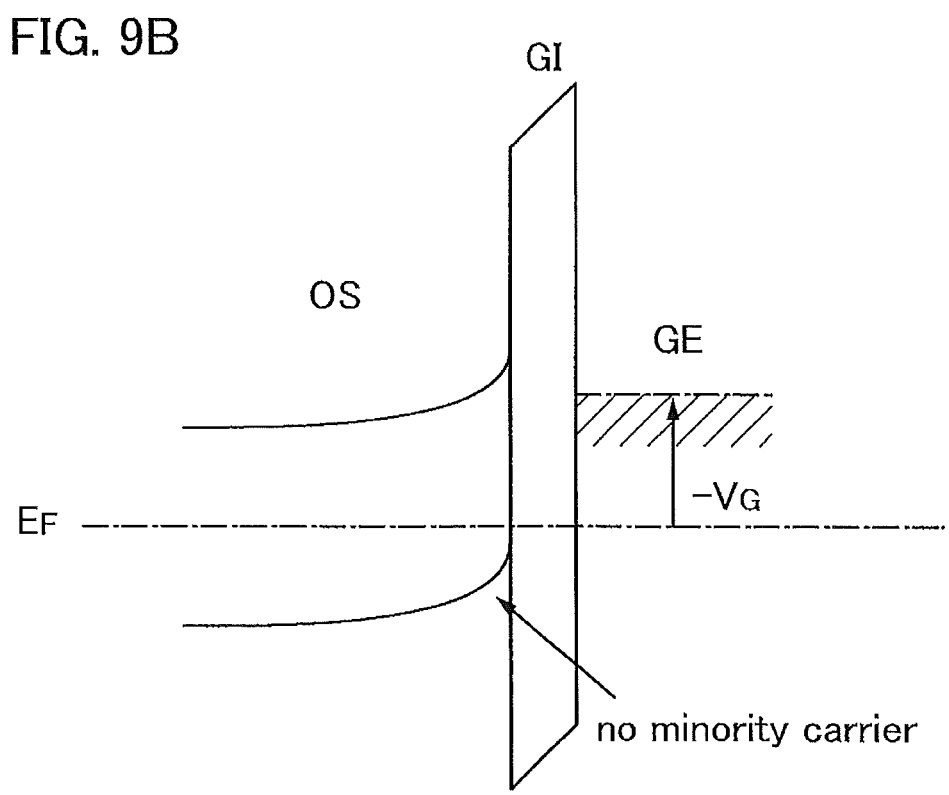

FIGS. 9A and 9B are energy band diagrams (schematic diagrams) of a cross-section taken along line B-B' in FIG. 7. FIG. 9A illustrates a state where a positive potential ($+V_G$) is applied to a gate electrode (GE) and an on state where carriers (electrons) flow between the source electrode and the drain electrode. FIG. 9B illustrates a state where a negative potential ($-V_G$) is applied to the gate electrode (GE) and an off state (a minority carrier does not flow).

Figure 10:
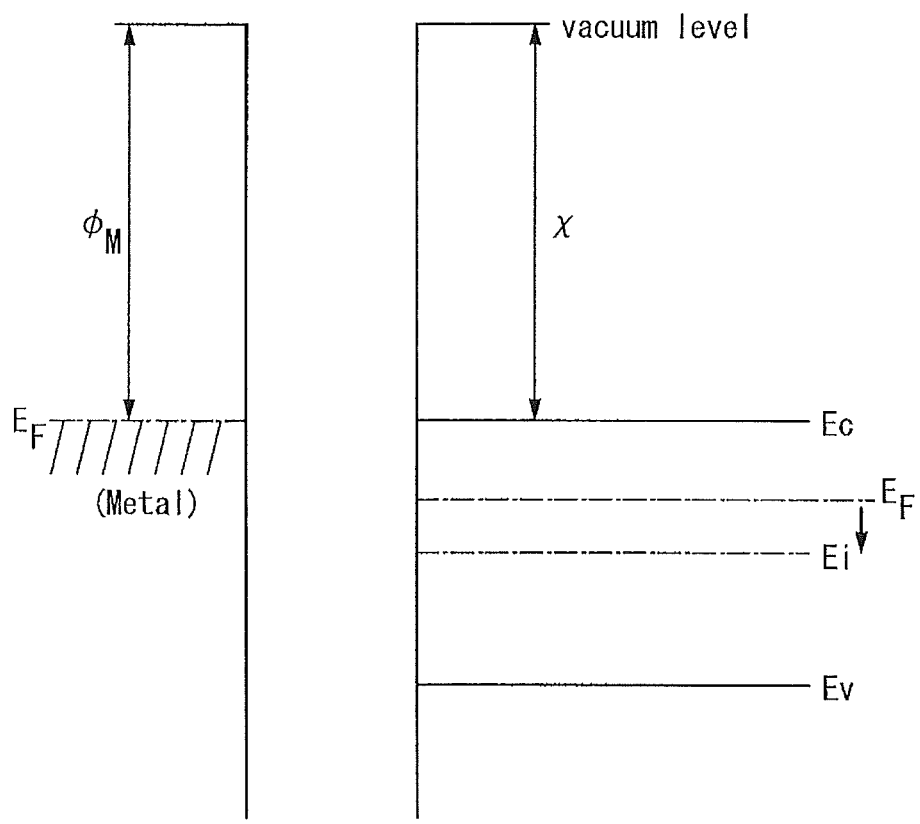
FIG. 10 is an energy band diagram of a transistor.

FIG. 10 illustrates a relation between a work function ($\phi_M$) of a vacuum level and a metal and electron affinity ($\chi$) of an oxide semiconductor.

Because metal is degenerated, the conduction band and the Fermi level correspond to each other. On the other hand, a conventional oxide semiconductor is typically an n-type semiconductor, in which case the Fermi level (Ef) is away from the intrinsic Fermi level (Ei) located in the middle of a band gap and is located closer to the conduction band. Note that it is known that hydrogen is a donor in an oxide semiconductor and is one factor causing an oxide semiconductor to be an n-type semiconductor.

In contrast, the oxide semiconductor film in this embodiment is made an intrinsic (i-type) or substantially intrinsic oxide semiconductor film obtained by removal of hydrogen atoms, which is n-type impurities, from an oxide semiconductor film to increase the purity so that an impurity other than a main component of the oxide semiconductor film includes as little as possible. In other words, a feature is that a highly-purified i-type (an intrinsic semiconductor), or a semiconductor close thereto, is obtained not by adding an impurity but by removing hydrogen atoms as much as possible. In this manner, the Fermi level (Ef) can be the same level as the intrinsic Fermi level (Ei).

In the case where the band gap (Eg) of an oxide semiconductor is 3.15 eV, the electron affinity ($\chi$) is said to be 4.3 eV. When the source electrode and the drain electrode are formed using titanium, for example, the work function of titanium is substantially equal to the electron affinity ($\chi$) of the oxide semiconductor. In that case, a Schottky barrier for electrons is not formed at an interface between the metal and the oxide semiconductor.

In other words, in the case where the work function of metal ($\phi_M$) and the electron affinity ($\chi$) of the oxide semiconductor are equal to each other and the metal and the oxide semiconductor are in contact with each other, an energy band diagram (a schematic diagram) as illustrated in FIG. 8A is obtained.

In FIG. 8B, a black circle (•) represents an electron, and when a positive potential is applied to the drain, the electron is injected into the oxide semiconductor film over the barrier (h) and flows toward the drain. In that case, the height of the barrier (h) is changed depending on gate voltage and drain voltage. When positive drain voltage is applied, the height (h) of the barrier is smaller than the height of the barrier of FIG. 8A without application of voltage, that is, ½ of the band gap (Eg).

At this time, the electron moves in the bottom, which is energetically stable, on the oxide semiconductor film side at the interface between the gate insulating film and the highly purified oxide semiconductor film as illustrated in FIG. 9A.

In FIG. 9B, when a negative potential (reverse bias) is applied to the gate electrode (GE), holes which are minority carriers are substantially zero; therefore, current is substantially close to zero.

Further, the band gap (Eg) of an oxide semiconductor is approximately three times larger than that of silicon in the case where the band gap (Eg) of the oxide semiconductor is 3.15 eV. The oxide semiconductor having such an Eg is resistant to an avalanche breakdown. In a transistor using an oxide semiconductor film in which the number of hydrogen atoms is reduced, voltage applied to a drain electrode can be larger than that of a transistor using an oxide semiconductor film in which the number of hydrogen atoms is not reduced or a transistor using silicon.

As described above, by the oxide semiconductor film 5 in which the number of hydrogen atoms is reduced, the operation of the transistor 15 can be favorable.

Next, a method for manufacturing a display device is described.

Figure 11A:
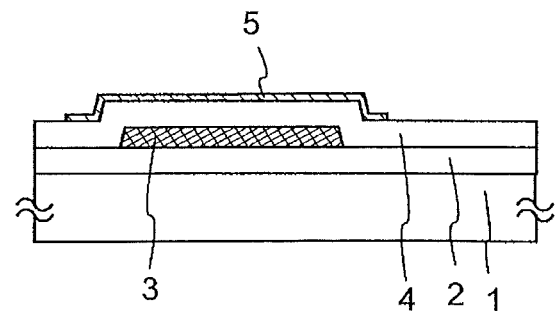
FIGS. 11A to 11C illustrate a manufacturing method of a display device.

The insulating film 2 serving as a base film is formed over the substrate 1 by a plasma CVD method, a sputtering method, or the like (FIG. 11A). Note that the insulating film 2 is preferably formed by a sputtering method in order not to include a large amount of hydrogen.

An example in which a silicon oxide film is formed is described. A sputtering gas containing high purity oxygen, from which hydrogen, water, hydroxyl, or hydride (also referred to as a hydrogen compound), or the like is removed, is introduced, and a silicon semiconductor target is used, whereby a silicon oxide film is formed over the substrate 1. The temperature of the substrate 1 may be room temperature, or the substrate 1 may be heated.

Alternatively, a silicon oxide film is formed as follows: quartz (preferably synthesized quart) is used as the target; the substrate temperature is 108° C.; the distance between the target and the substrate is 60 mm; the pressure is 0.4 Pa; the high-frequency power is 1.5 kW; the atmosphere is oxygen and argon (flow rate ratio of oxygen to argon is 25 sccm:25 sccm=1:1); and an RF sputtering method is used. As a sputtering gas, oxygen or a mixed gas of oxygen and argon is used.

The insulating film 2 is preferably formed removing moisture remaining in the deposition chamber. This is for preventing hydrogen, water, hydroxyl, hydride, or the like from being contained in the insulating film 2.

In order to remove residual moisture from the treatment chamber, an adsorption-type vacuum pump is preferably used. For example, a cryopump, an ion pump, or a titanium sublimation pump is preferably used. The evacuation unit may be a turbo pump provided with a cold trap. In the deposition chamber in which exhaustion is performed with the use of a cryopump, hydrogen, water, hydroxyl, hydride, or the like, is exhausted. Accordingly, the concentration of impurities included in the insulating film 2 formed in the deposition chamber can be reduced.

It is preferable to use a high-purity gas from which an impurity such as hydrogen, water, hydroxyl, or hydride is removed to a level of parts per million or parts per billion, as a sputtering gas.

Examples of a sputtering method include an RF sputtering method in which a high-frequency power source is used for a sputtering power supply, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

Furthermore, as a deposition method using a sputtering method, there are also a reactive sputtering method in which a target substance and a sputtering gas component are chemically reacted with each other during deposition to form a thin compound film thereof, and a bias sputtering method in which voltage is also applied to a substrate during deposition.

As the sputtering in this specification, the above-described sputtering device and the sputtering method can be employed as appropriate.

In the case where a silicon nitride film and a silicon oxide film are stacked to form the insulating film 2, the silicon nitride film and the silicon oxide film are formed in the same deposition chamber with the use of a common silicon target. First, a sputtering gas including nitrogen is introduced, and a silicon target provided in the deposition chamber is used, whereby the silicon nitride film is formed. Then, the sputtering gas is switched to a sputtering gas including oxygen, and the same silicon target is used, whereby the silicon oxide film is formed. The silicon nitride film and the silicon oxide film can be formed in succession without being exposed to air; therefore, impurities such as hydrogen, water, hydroxyl, or hydride can be prevented from being adsorbed on the surface of the silicon nitride film.

A conductive film is formed over the insulating film 2, and then etching is performed on the conductive film with the use of a resist mask formed in a photolithography process, so that the first gate electrode 3 is formed (FIG. 11A). Note that the conductive film is preferably formed by a sputtering method in order to prevent hydrogen, hydroxyl, or moisture from being contained in the conductive film. An end portion of the first gate electrode 3 preferably has a tapered shape because coverage with the first gate insulating film 4 stacked later can be improved.

The first gate insulating film 4 is formed over the first gate electrode 3. Note that the first gate insulating film 4 is preferably formed by a sputtering method in order to prevent hydrogen, hydroxyl, or moisture from being contained in the conductive film. Therefore, as pretreatment for deposition, it is preferable that the substrate 1 provided with the first gate electrode 3 be preheated in a preheating chamber of a sputtering apparatus and impurities such as hydrogen, water, hydroxyl, or hydride adsorbed on the substrate 1 be eliminated and evacuated. The preheat temperature is equal to or greater than 100° C. and equal to or less than 400° C., preferably equal to or greater than 150° C. and equal to or less than 300° C. Note that as an evacuation means, a cryopump is preferably provided in the preheating chamber. Note that this preheating treatment can be omitted.

For example, in the case where a silicon oxide film is formed as the first gate insulating film 4, a silicon target or a quartz target is used as a target, and oxygen or a mixed gas of oxygen and argon is used as a sputtering gas.

The oxide semiconductor film is formed over the first gate insulating film 4 by a sputtering method. Note that before the oxide semiconductor film is formed by a sputtering method, powdery substances (also referred to as particles or dust) attached on a surface of the first gate insulating film 4 are preferably removed by reverse sputtering in which an argon gas is introduced and plasma is generated. The reverse sputtering refers to a method in which, without application of voltage to a target side, a high-frequency power source is used for application of voltage to a substrate side in an argon atmosphere to generate plasma in the vicinity of the substrate and modify a surface. Note that instead of an argon atmosphere, a nitrogen atmosphere, a helium atmosphere, an oxygen atmosphere, or the like may be used.

A target including an oxide semiconductor is used. For example, a target of a metal oxide containing zinc oxide as a main component is used. As another example of a metal oxide target, an oxide semiconductor target containing In, Ga, and Zn (a composition ratio of $In_2O_3:Ga_2O_3:ZnO=1:1:1$ [mol %], that is, $In:Ga:Zn=1:1:0.5$ [atom %]) can be used. In addition, as the oxide semiconductor target containing In, Ga, and Zn, a target having a composition ratio of $In:Ga:Zn=1:1:1$ [atom %] or $In:Ga:Zn=1:1:2$ [atom %] can be used. The filling rate of the oxide semiconductor target is equal to or greater than 90% and equal to or less than to 100%, preferably equal to or greater than 95% and equal to or less than 99.9%. With the use of the oxide semiconductor target with a high filling rate, a dense oxide semiconductor film is formed. A target containing Sift at 2 wt % or more and 10 wt % or less may be used.

The oxide semiconductor film is deposited in a rare gas (typically argon) atmosphere, an oxygen atmosphere, or an atmosphere containing a rare gas (typically argon) and oxygen.

It is preferable to use a high-purity gas from which an impurity such as hydrogen, water, hydroxyl, or hydride is removed to by a level of parts per million or parts per billion, as a sputtering gas.

The substrate 1 is held in a deposition chamber kept under reduced pressure, a sputtering gas from which an impurity such as hydrogen, water, hydroxyl, or hydride is removed is introduced while removing residual moisture in the deposition chamber, and the above target is used, whereby the oxide semiconductor film is formed. In order to remove residual moisture from the deposition chamber, an adsorption-type vacuum pump is preferably used. For example, a cryopump, an ion pump, or a titanium sublimation pump is preferably used. The evacuation unit may be a turbo pump provided with a cold trap. In a deposition chamber which is evacuated using a cryopump, for example, hydrogen atoms, compounds including hydrogen atoms such as water ($H_2O$) (more preferably, compounds including carbon atoms as well), or the like are exhausted; therefore, the concentration of impurities contained in the oxide semiconductor film which is deposited in the deposition chamber can be reduced. The substrate 1 may be heated to a temperature of less than 400° C. when the oxide semiconductor film is formed.

An example of the deposition condition is as follows: the temperature of the substrate 1 is room temperature, the distance between the substrate and the target is 110 mm, the pressure is 0.4 Pa, the direct current (DC) power is 0.5 kW, and the atmosphere is an atmosphere containing oxygen and argon (the flow ratio of oxygen to argon is 15 sccm:30 sccm). Note that a pulse direct current (DC) power is preferable because particles can be reduced and the film thickness can be uniform. The preferable thickness of the oxide semiconductor film is equal to or greater than 2 nm and equal to or less than 200 nm. Note that an appropriate thickness differs depending on an oxide semiconductor material, and the thickness may be set as appropriate depending on the material.

Then, the oxide semiconductor film is etched with a resist mask that is formed by a photolithography process, so that the oxide semiconductor film 5 is formed (FIG. 11A). Note that the etching of the oxide semiconductor film may be dry etching, wet etching, or both dry etching and wet etching.

As the etching gas for dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used.

As an etchant used for wet etching, a solution obtained by mixing phosphoric acid, acetic acid, and nitric acid, an ammonia peroxide mixture (hydrogen peroxide water at 31 wt %:ammonia water at 28 wt %:water=5:2:2), or the like can be used. In addition, ITO07N (manufactured by KANTO CHEMICAL CO., INC.) may also be used.

Heat treatment (also referred to as a first heat treatment) may be performed on the oxide semiconductor film 5. The temperature of the heat treatment is equal to or greater than 400° C. and equal to or less than 750° C., preferably equal to or greater than 400° C. and less than the strain point of the substrate 1. The heat treatment time may be 0.5 hours to 5 hours. By this heat treatment, hydrogen atoms contained in the oxide semiconductor film 5 can be removed. For example, in an electric furnace, heat treatment is performed on the oxide semiconductor film 5 in a nitrogen atmosphere at 450° C. for one hour or at 650° C. for one hour, and then, the oxide semiconductor film is not exposed to the air, whereby hydrogen atoms can be prevented from entering the oxide semiconductor film 5. Note that the oxide semiconductor film 5 is crystallized in some cases through the first heat treatment. TEM analysis in the case where heat treatment is performed at 650° C. for one hour is shown in Example 2.

The apparatus for the heat treatment is not limited to the electric furnace and may be provided with a device for heating the oxide semiconductor film 5, using heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating the oxide semiconductor film 5 by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with the oxide semiconductor film 5 by heat treatment, such as nitrogen or a rare gas such as argon is used.

GRTA heats the oxide semiconductor film 5 for 2 minutes to 5 minutes in an inert gas atmosphere at a temperature as high as 650° C. to 700° C. With GRTA, high-temperature heat treatment for a short period of time can be achieved.

Note that it is preferable that in the heat treatment, hydrogen, water, hydroxyl, or hydride, or the like be not contained in nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

As described above, depending on the conditions of the heat treatment or the material of the oxide semiconductor film, the oxide semiconductor film may be crystallized to be a microcrystalline film or a polycrystalline film. For example, the oxide semiconductor film may crystallize to become a microcrystalline oxide semiconductor film having a degree of crystallization of 90% or more, or 80% or more. Further, depending on the conditions of the first heat treatment or the material of the oxide semiconductor film, the oxide semiconductor film may become an amorphous oxide semiconductor film which does not contain a crystalline component. Furthermore, the oxide semiconductor film may become an oxide semiconductor film in which a microcrystalline portion (with a grain diameter equal to or greater than 1 nm and equal to or less than or 20 nm (typically equal to or greater than 2 nm and equal to or less than 4 nm)) is mixed in an amorphous oxide semiconductor.

Moreover, after the above heat treatment is performed, a second heat treatment may be performed in atmosphere of oxygen which does not contain hydrogen, water, hydroxyl, hydride, or the like, or in an atmosphere of nitrogen and oxygen which does not contain hydrogen, water, hydroxyl, hydride, or the like. Since oxygen in the oxide semiconductor film 5 is removed in some cases through the above first heat treatment, oxygen can be introduced in the oxide semiconductor film 5 through the second heat treatment.

Note that it is preferable to perform reverse sputtering before formation of a conductive film in the following step so that a resist residue and the like attached to surfaces of the oxide semiconductor film 5 and the first gate insulating film 4 can be removed.

Figure 11B:
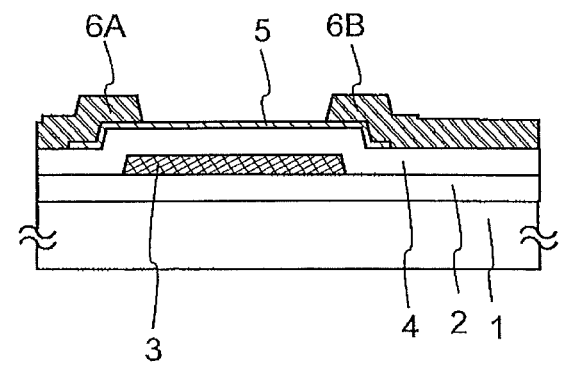

The conductive film is formed by a sputtering method over the oxide semiconductor film 5 and the first gate insulating film 4. The above pretreatment is preferably performed before the film formation so that hydrogen, hydroxyl, and moisture are contained as little as possible in the conductive film. The conductive film is etched with a resist mask that is formed by a photolithography step, so that the electrode 6A (one of a source electrode and a drain electrode) and the electrode 6B (the other of the source electrode and the drain electrode) are formed (FIG. 11B).

Next, plasma treatment using a gas such as $N_2O$, $N_2$, or Ar is performed to remove water or the like adsorbed on a surface of the oxide semiconductor film 5 which is exposed. Alternatively, plasma treatment is performed using a mixture gas of oxygen and argon.

Figure 11C:
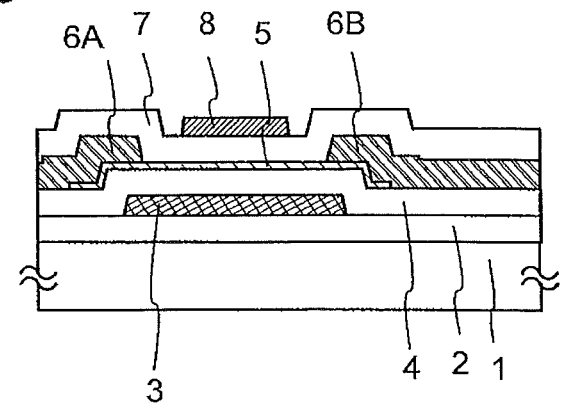

After the plasma treatment is performed, the second gate insulating film 7 is formed over the oxide semiconductor film 5, the electrode 6A, and the electrode 6B, without exposure to the air (FIG. 11C). In a region where the oxide semiconductor film 5 is not in contact with any one of the electrode 6A and the electrode 6B, the oxide semiconductor film 5 is in contact with the second gate insulating film 7. Further, the second gate insulating film 7 covers the electrode 6A and the electrode 6B.

As the second gate insulating film 7, a silicon oxide film having a defect, for example, is formed as follows: a sputtering gas containing high-purity oxygen in which hydrogen and moisture are removed is introduced while heating the substrate 1 at room temperature or at a temperature of less than 100° C., and a silicon semiconductor target is used.

For example, a silicon oxide film is formed by a pulsed DC sputtering method with use of a boron-doped silicon target which has a purity of 6N (a resistivity of 0.01 Ωcm, in which the distance between the substrate and the target is 89 mm, the pressure is 0.4 Pa, the direct current (DC) power is 6 kW, and the atmosphere is an oxygen atmosphere (the proportion of oxygen flow is 100%). Note that instead of a silicon target, quartz (preferably, synthetic quartz) can be used as a target used when the silicon oxide film is formed. As a sputtering gas, oxygen or a mixed gas of oxygen and argon is used.

In this case, it is preferable that the second gate insulating film 7 be formed while residual moisture in the treatment chamber is removed. This is for preventing hydrogen, hydroxyl, or moisture from being contained in the oxide semiconductor film 5 and the second gate insulating film 7. In order to remove residual moisture from the treatment chamber, an adsorption-type vacuum pump is preferably used.

Heat treatment may be performed at 100° C. to 400° C. while the second gate insulating film 7 and the oxide semiconductor film 5 are in contact with each other. The second gate insulating film 7 has a lot of defects. By this heat treatment, an impurity such as hydrogen, moisture, hydroxyl, or hydride included in the oxide semiconductor film 5 can be diffused into the second gate insulating film 7 and the number of hydrogen atoms contained in the oxide semiconductor film 5 can be further reduced.

A conductive film is formed over the second gate insulating film 7. The conductive film is etched with a resist mask that is formed by a photolithography step, so that the second gate electrode 8 is formed (FIG. 11C). Note that the conductive film is preferably formed by a sputtering method in order to prevent hydrogen, hydroxyl, or moisture from being contained in the conductive film. In the case where the second gate electrode 8 is electrically connected to the first gate electrode 3, a contact hole is formed in the second gate insulating film 7 and the first gate insulating film 4 before the conductive film is formed. The contact hole reaches the first gate electrode 3. The conductive film is formed after the contact hole is formed. The second gate electrode 8 is formed of the conductive film.

Figure 12A:
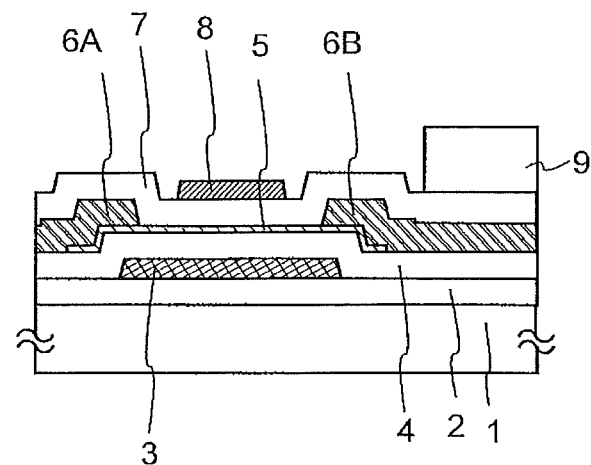
FIGS. 12A and 12B illustrate a manufacturing method of a display device.

An organic resin film is formed over the second gate insulating film 7 as a planarizing film. The organic resin film is formed by a spin-coating method or the like. The organic resin film is selectively etched to form the organic resin film 9 (FIG. 12A).

Figure 12B:
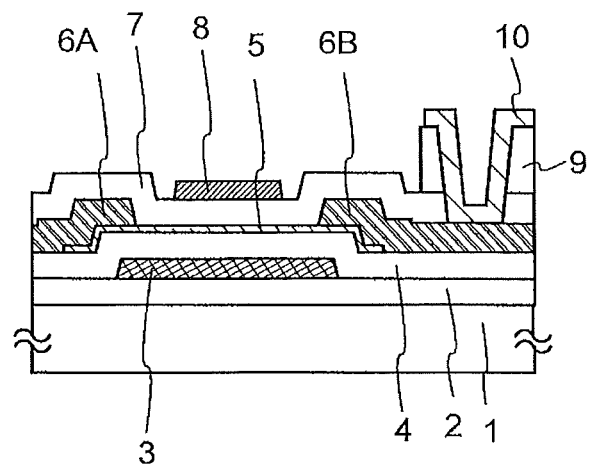

An opening reaching the electrode 6B is formed in the organic resin film 9 and the second gate insulating film 7. The pixel electrode 10 is formed in the opening (FIG. 12B). The pixel electrode 10 is electrically connected to the electrode 6B.

A display medium is provided over the pixel electrode 10, the second gate electrode 8, and the second gate insulating film 7 (FIGS. 14A, 15A, 16A, and 22A).

Figure 13:
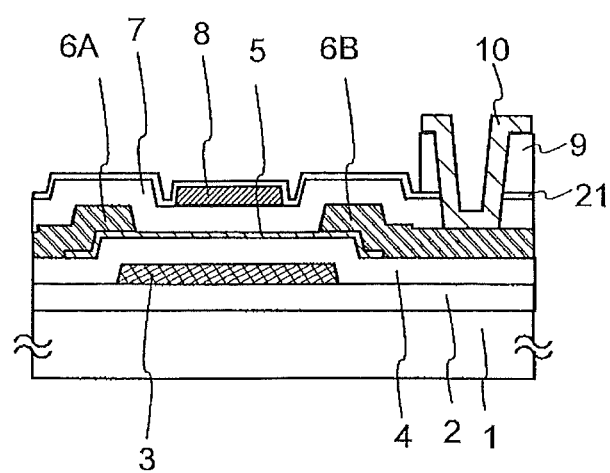
FIG. 13 illustrates a method for manufacturing a display device.

An insulating film 21 serving as a passivation film may be formed to have a thickness of 10 nm to 200 nm over the second gate electrode 8 and the second gate insulating film 7 (FIG. 13). A silicon oxide film, a silicon nitride film, or the like can be used for the insulating film 21. As the insulating film 21, a silicon oxide film, a silicon nitride film, or the like, is formed as follows: a sputtering gas containing high-purity oxygen in which hydrogen and moisture are removed is introduced while heating the substrate 1 at room temperature or at a temperature of less than 100° C., and a silicon semiconductor target is used.

The organic resin film 9 is formed over the insulating film 21 as a planarizing film. The opening reaching the electrode 6B is formed in the organic resin film 9, the insulating film 21, and the second gate insulating film 7. The pixel electrode 10 is formed in the opening (FIG. 13). A display medium is provided over the pixel electrode 10 and the insulating film 21 (FIGS. 14B, 15B, 16B, and 22B).

Hereinafter, as a display medium, liquid crystal, EL, and electronic paper are described. Note that the display medium is not limited to liquid crystal, EL, and electronic paper.

<Liquid Crystal>

Figure 14A:
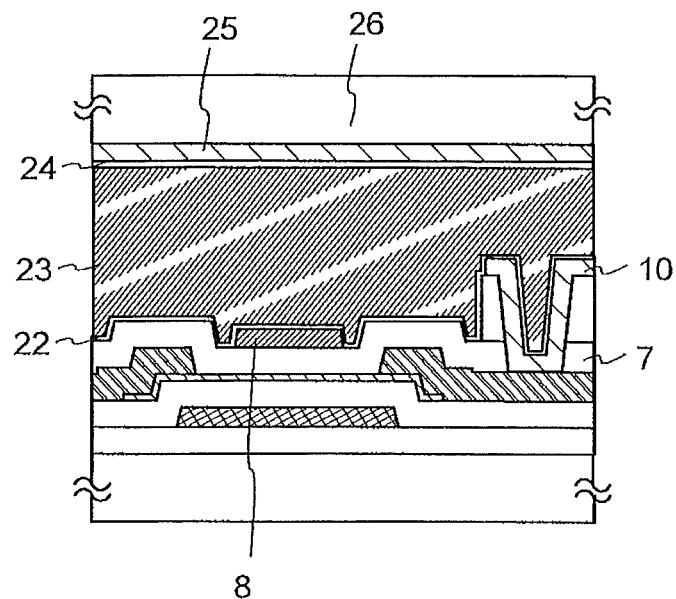
FIGS. 14A and 14B each illustrate a display device.

FIG. 14A illustrates a case where the display medium is liquid crystal. A first alignment film 22 is formed over the pixel electrode 10. The first alignment film 22 is also formed over and in contact with the second gate electrode 8 and the second gate insulating film 7. A liquid crystal layer 23 is formed over the first alignment film 22. A second alignment film 24 is formed over the liquid crystal layer 23. The liquid crystal layer 23 is provided between the first alignment film 22 and the second alignment film 24. An electrode 25 serving as a counter electrode is formed over the second alignment film 24 and a substrate 26 serving as a counter substrate is formed over the electrode 25. The first alignment film 22 and the second alignment film 24 are not necessarily formed as long as the liquid crystal layer 23 is aligned. A spacer may be provided in order to keep a cell gap.

As for a mode which is used in the liquid crystal display, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be employed. Alternatively, a blue phase mode may be used.

The first alignment film 22, the second alignment film 24, the electrode 25, and the substrate 26 are formed using known materials.

The first alignment film 22, the liquid crystal layer 23, the second alignment film 24, and the electrode 25 are formed by known methods.

Figure 14B:
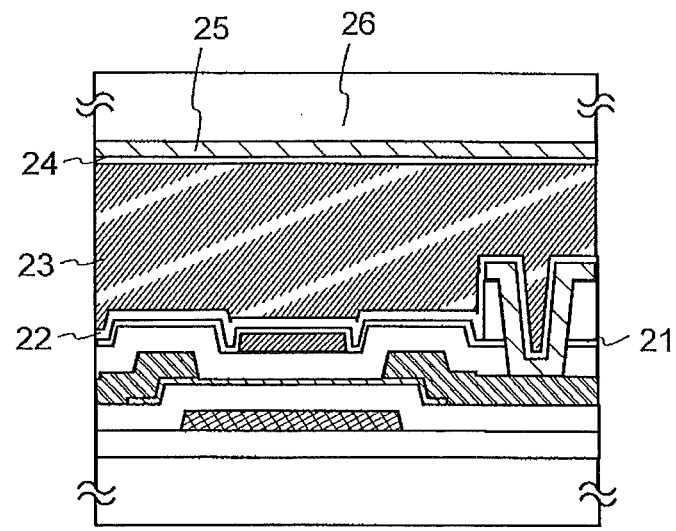

As described above, the insulating film 21 serving as a passivation film may be formed (FIG. 14B). The first alignment film 22 is formed over and in contact with the insulating film 21 and the pixel electrode 10.

<EL>

Figure 15A:
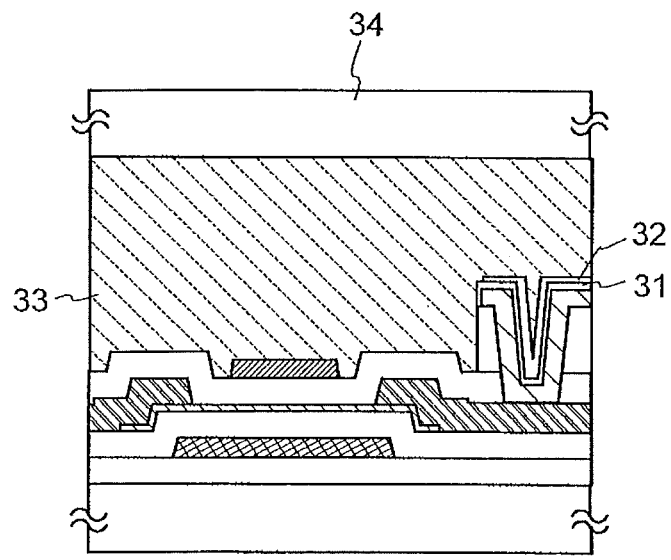
FIGS. 15A and 15B each illustrate a display device.

FIG. 15A illustrates a case where the display medium is EL. An EL layer 31 is formed over the pixel electrode 10. An electrode 32 serving as a counter electrode is formed over the EL layer 31. The EL layer 31 and the electrode 32 need not to be formed over the second gate electrode 8 and the second gate insulating film 7. A sealing material 33 is formed over and in contact with the second gate electrode 8, the second gate insulating film 7, and the electrode 32. A substrate 34 serving as a sealing substrate is formed over the sealing material 33.

EL layers are classified into an organic EL layer and an inorganic EL layer. Further, inorganic EL layers are classified into a dispersion type inorganic EL and a thin-film type inorganic EL.

In the case of an organic EL layer, the EL layer 31 includes, for example, a hole-injection layer, a hole-transport layer, a light-emitting layer, an electron-transport layer, and an electron-injection layer. In the light-emitting layer, a dopant material is added to a host material. As for a dopant material, a phosphorescent light-emitting material or a fluorescent light-emitting material is used.

In the case of a dispersion type inorganic EL, the EL layer 31 includes a light-emitting layer in which particles of the light-emitting material are dispersed in a binder. In the case of a thin-film type inorganic EL, the EL layer 31 has a structure in which a light-emitting layer is provided between dielectric layers.

As for the sealing material 33, an ultraviolet curable resin or a thermosetting resin can be used, as well as an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used.

The EL layer 31, the electrode 32, the sealing material 33, and the substrate 34 are formed using known materials. In addition, the EL layer 31, the electrode 32, and the sealing material 33 are formed by known methods.

Figure 15B:
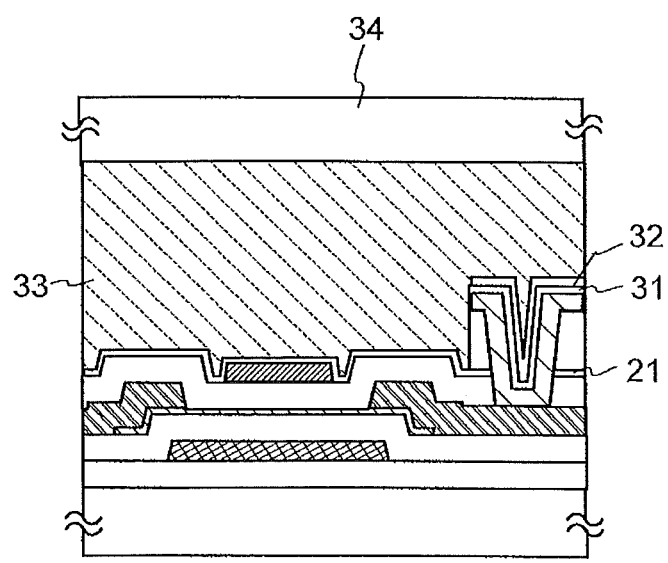

As described above, the insulating film 21 serving as a passivation film may be formed (FIG. 15B). The sealing material 33 is formed over and in contact with the insulating film 21 and the electrode 32.

<Electronic Paper>

Figure 16A:
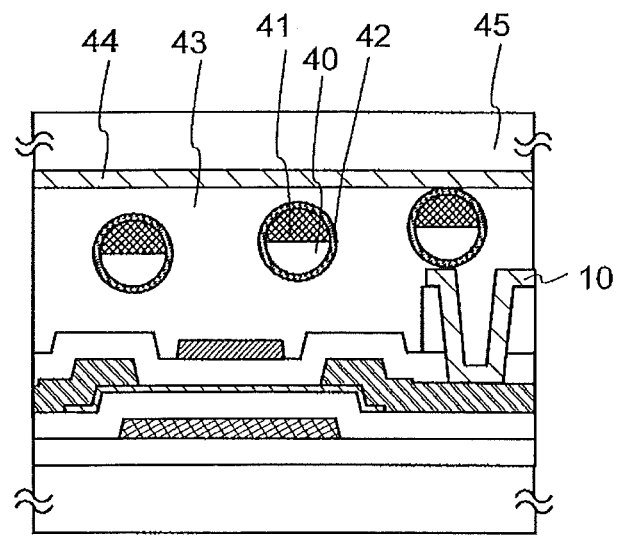
FIGS. 16A and 16B each illustrate a display device.

FIG. 16A illustrates a case where the display medium is electronic paper. In FIG. 16A, a twisting ball display system is used. The twist ball display system refers to a method in which spherical particles each colored in black and white which are arranged between the pixel electrode 10 and the electrode 44 are used for a display element, and a potential difference is generated between the pixel electrode 10 and the electrode 44 to control the orientation of the spherical particles, so that display is performed.

A filler 43 such as a resin is formed over and in contact with the pixel electrode 10, the second gate electrode 8, and the second gate insulating film 7. In the filler 43, each of spherical particles including a cavity 42 is provided. The cavity 42 includes a black region 41 and a white region 40. The electrode 44 serving as a counter electrode is formed over the filler 43. A substrate 45 serving as a counter substrate is provided over the electrode 44.

Figure 22A:
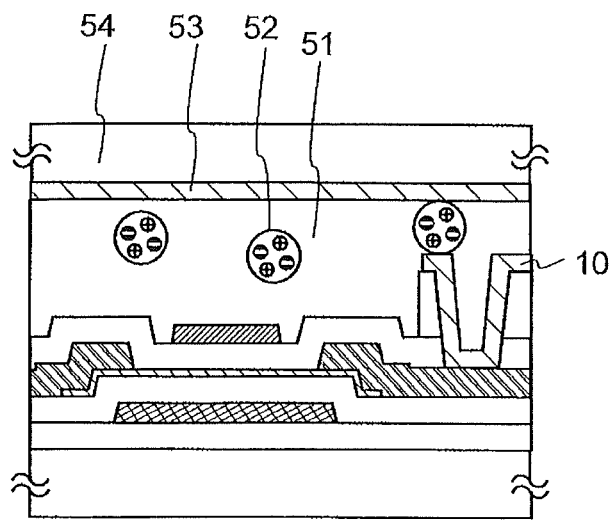
FIGS. 22A and 22B each illustrate a display device.

Instead of the twist ball display system, an electrophoretic display system can be used (FIG. 22A). An electronic ink layer 51 is formed over and in contact with the pixel electrode 10, the second gate electrode 8, and the second gate insulating film 7. In the electronic ink layer 51, a microcapsule 52 having a diameter of about 10 μm to 200 μm in which positively charged white microparticles and negatively charged black microparticles are encapsulated, is provided. An electrode 53 serving as a counter electrode is formed over the electronic ink layer 51 and a substrate 54 serving as a counter substrate is provided over the electrode 53.

The filler 43, the cavity 42, the electrode 44, the substrate 45, the electronic ink layer 51, the microcapsule 52, the electrode 53 and the substrate 54 are formed using known materials. In addition, the filler 43, the cavity 42, the electrode 44, the electronic ink layer 51, the microcapsule 52, and the electrode 53 are formed by known methods.

Figure 16B:
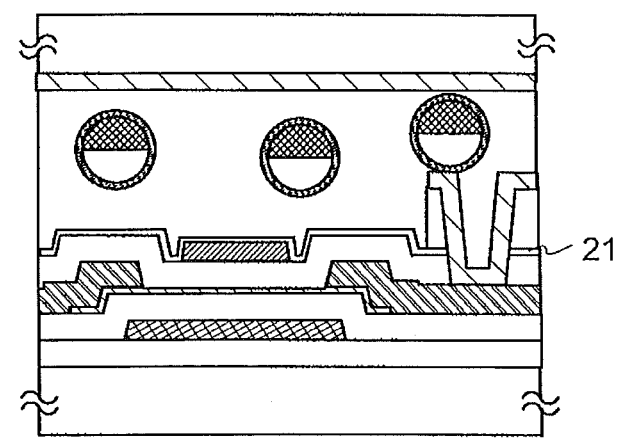
Figure 22B:
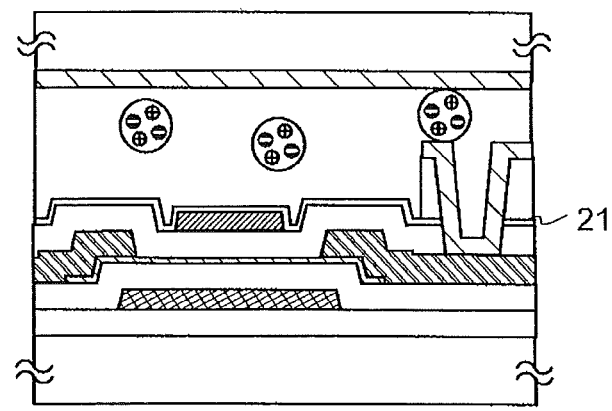

As described above, the insulating film 21 serving as a passivation film may be formed (FIG. 16B and FIG. 22B). The filler 43 or the electronic ink layer 51 is formed over and in contact with the insulating film 21 and the pixel electrode 10.

A display device according to the present invention can be applied to a variety of electronic devices (including an amusement machine). Examples of electronic devices are a television set (also referred to as a television or a television receiver), a monitor of a computer or the like, a digital camera, a digital video camera, a digital photo frame, a mobile phone (also referred to as a portable telephone or a mobile phone device), a portable game console, a portable information terminal, an audio reproducing device, a large-sized game machine such as a pachinko machine, and the like.

Figure 23A:
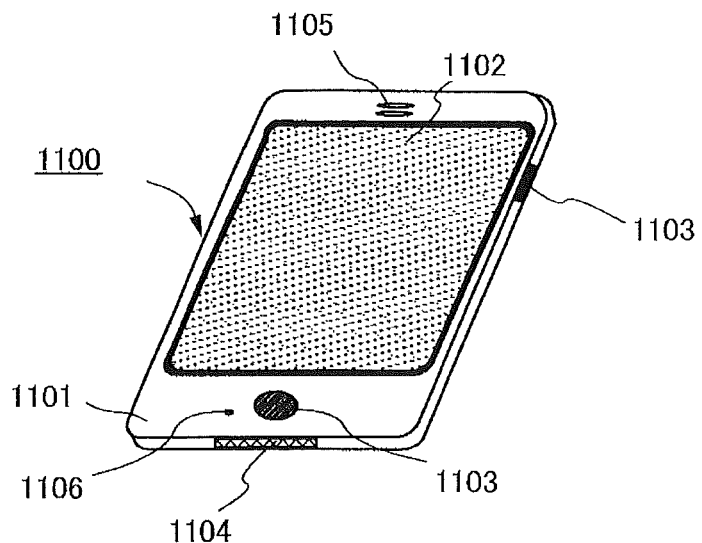
FIGS. 23A and 23B show a mobile phone and a portable information terminal, respectively.

FIG. 23A illustrates an example of a mobile phone. A mobile phone 1100 is provided with a display portion 1102 incorporated in a housing 1101, operation buttons 1103, an external connection port 1104, a speaker 1105, a microphone 1106, and the like. The above display device is provided for the display portion 1102.

Figure 23B:
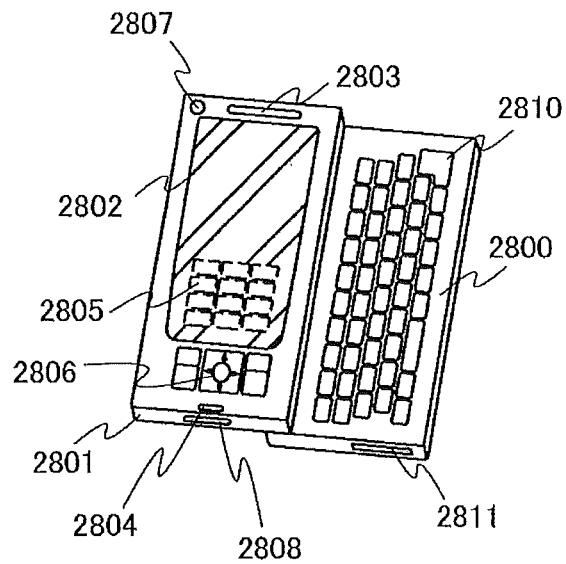

FIG. 23B illustrates an example of a portable information terminal. The portable information terminal includes a housing 2800 and a housing 2801. The housing 2800 includes a display panel 2802, a speaker 2803, a microphone 2804, a pointing device 2806, a camera lens 2807, an external connection terminal 2808, and the like. The housing 2801 includes a keyboard 2810, an external memory slot 2811, and the like. Further, an antenna is incorporated in the housing 2801. The above display device is provided for the display panel 2802.

Figure 24A:
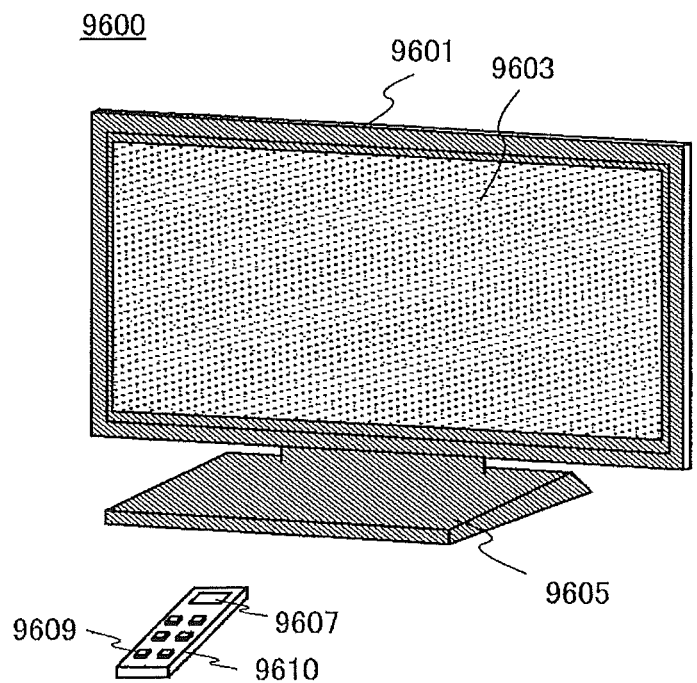
FIGS. 24A and 24B illustrate a television set and a digital photo frame, respectively.

FIG. 24A illustrates an example of a television set. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610. The above display device is provided for the display portion 9603 and the display portion 9607.

Figure 24B:
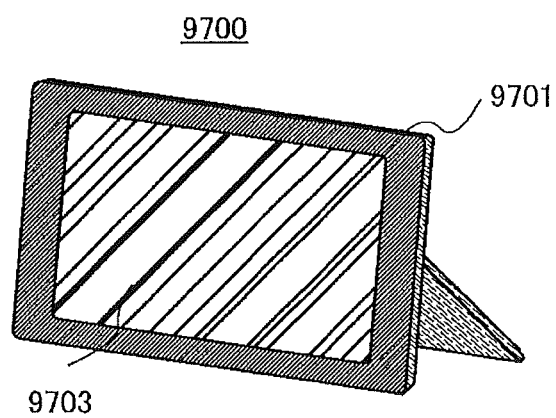

FIG. 24B illustrates an example of a digital photo frame. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame. The above display device is provided for the display portion 9703.

Figure 25:
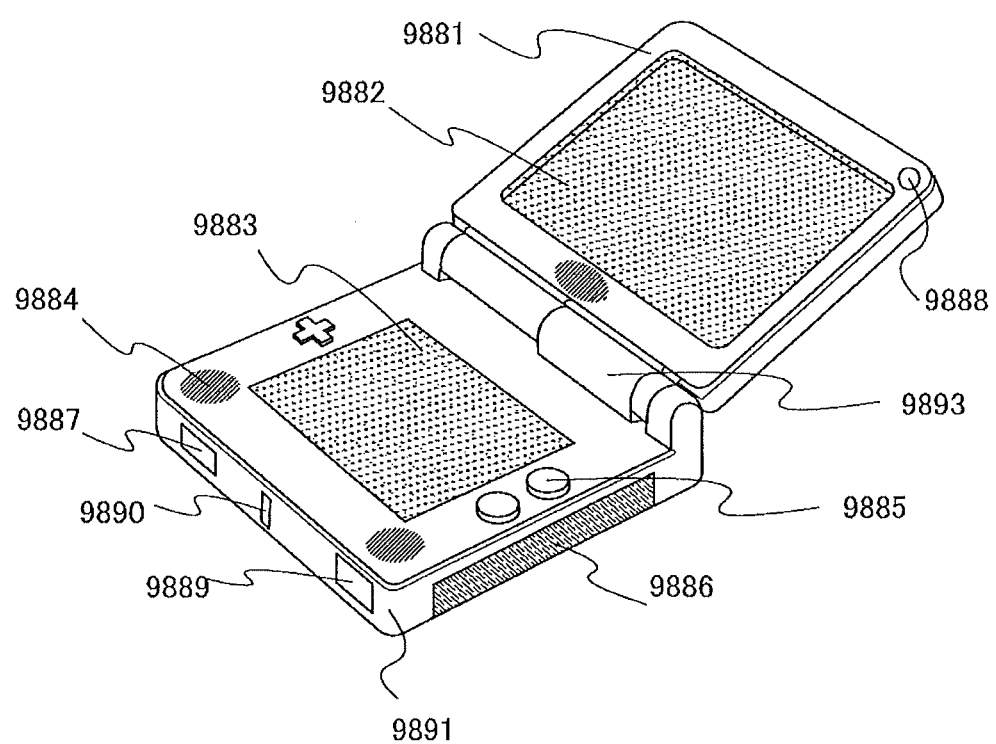
FIG. 25 illustrates a portable amusement machine.

FIG. 25 illustrates a portable game console including a housing 9881 and a housing 9891 which are jointed with a connector 9893 so as to be opened and closed. A display portion 9882 and a display portion 9883 are incorporated in the housing 9881 and the housing 9891, respectively. The above display device is provided for the display portion 9883.

Figure 26:
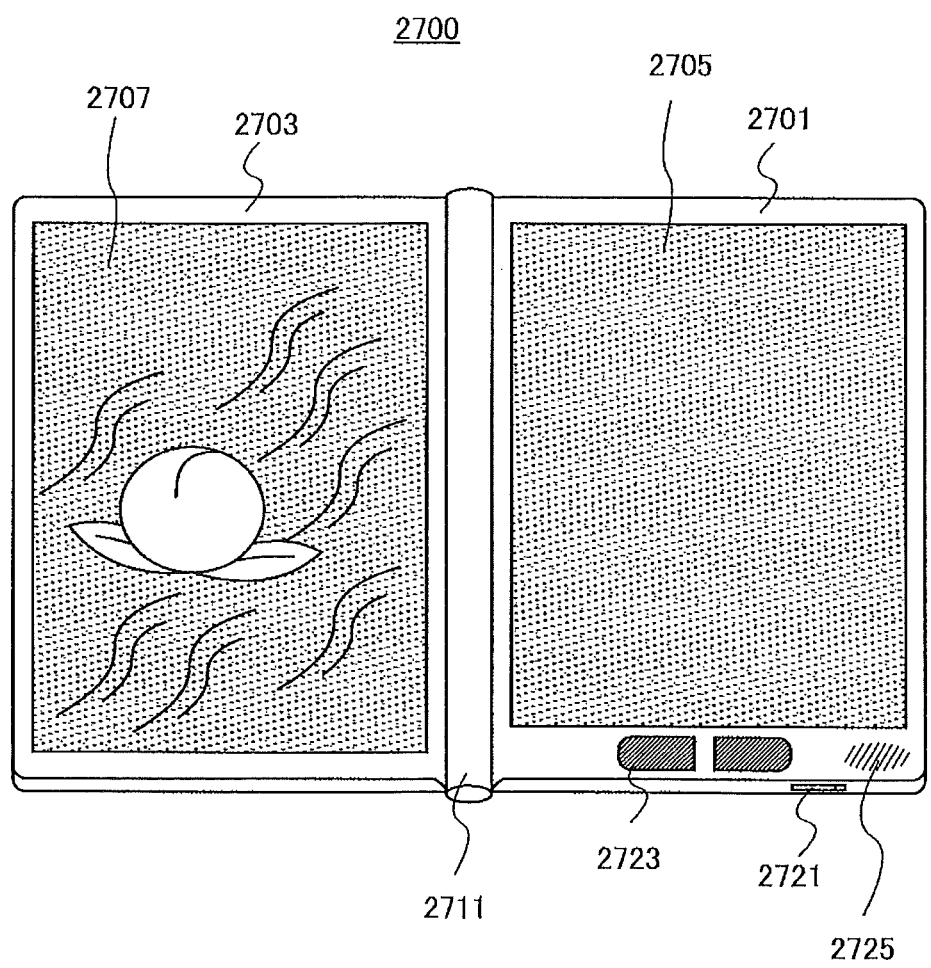
FIG. 26 illustrates an electronic book.

FIG. 26 illustrates an example of an electronic book. For example, the electronic book 2700 includes a housing 2701 and a housing 2703. The housing 2701 and the housing 2703 are combined with a hinge 2711 so that the electronic book 2700 can be opened and closed with the hinge 2711 as an axis. With such a structure, the electronic book 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 26) and graphics can be displayed on a display portion on the left side (the display portion 2707 in FIG. 26).

FIG. 26 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like can also be provided on the same face as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the electronic book 2700 may have a function of an electronic dictionary.

The above display device is provided for the display portion 2705 and the display portion 2707.

Example 1

Figure 17:
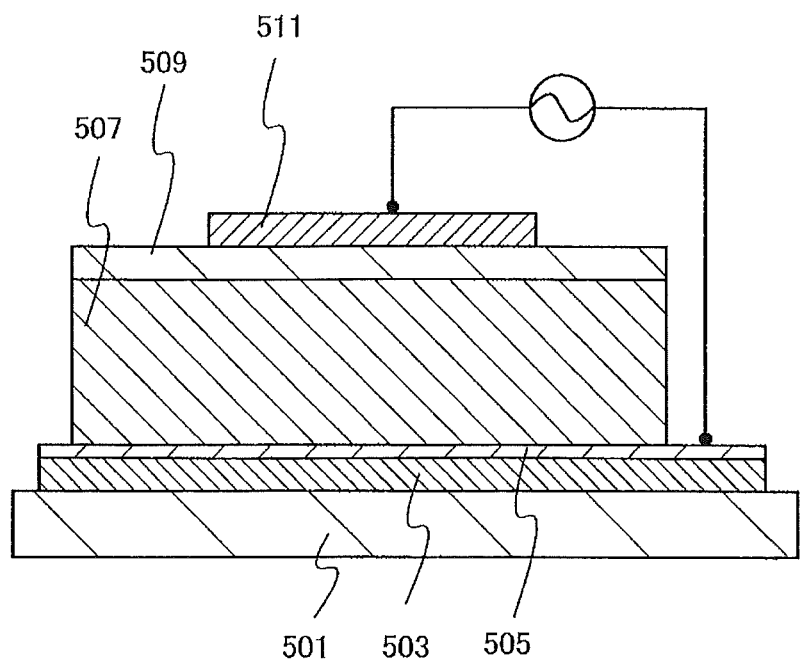
FIG. 17 shows a C-V measurement.

In this example, a method for calculating the carrier density of an oxide semiconductor film is described with reference to FIGS. 17, 18A and 18B.

First, the structure of a sample used in a C-V (Capacitance-Voltage) measurement is described with reference to FIG. 17.

A titanium film 503 with a thickness of 300 nm was formed by a sputtering method over a glass substrate 501 and a titanium nitride film 505 with a thickness of 100 nm was formed by a sputtering method thereover.

As an oxide semiconductor film 507 in which the number of hydrogen atoms were reduced, an In—Ga—Zn—O film with a thickness of 2000 nm was formed by a sputtering method over the titanium nitride film 505. The deposition condition at this time was as follows: as the sputtering gas, Ar at a flow rate of 30 sccm and oxygen at a flow rate of 15 sccm were used, the distance between the target and the substrate was 60 mm, the direct current (DC) power was 0.5 kW, and the deposition atmosphere temperature was room temperature.

Next, a silicon oxynitride film 509 with a thickness of 300 nm was formed by a CVD method and a silver film 511 with a thickness of 300 nm was formed thereover.

Figure 18A:
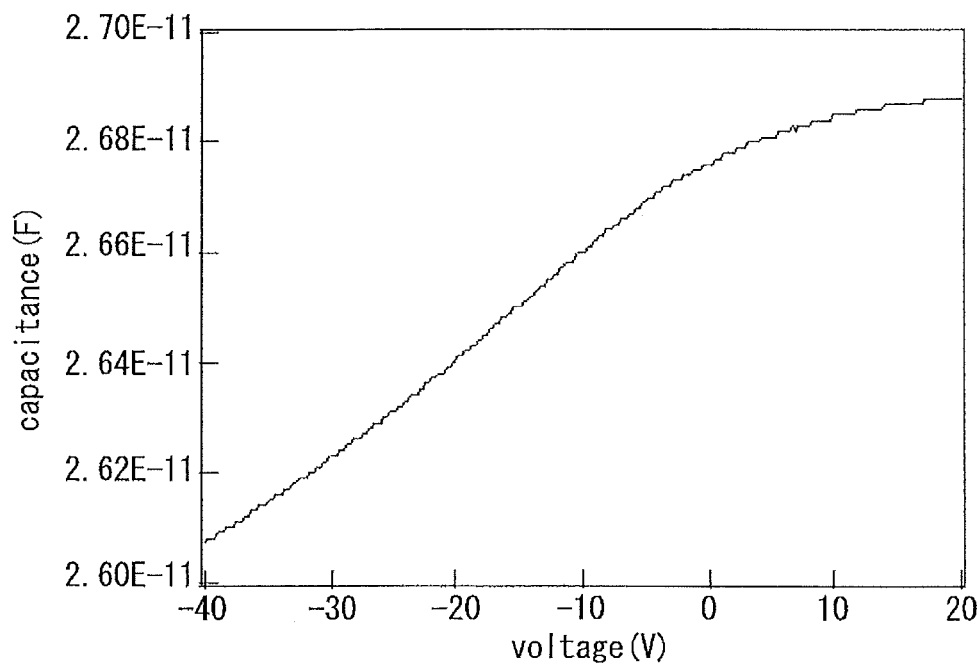
FIGS. 18A and 18B show a C-V measurement.
Figure 18B:
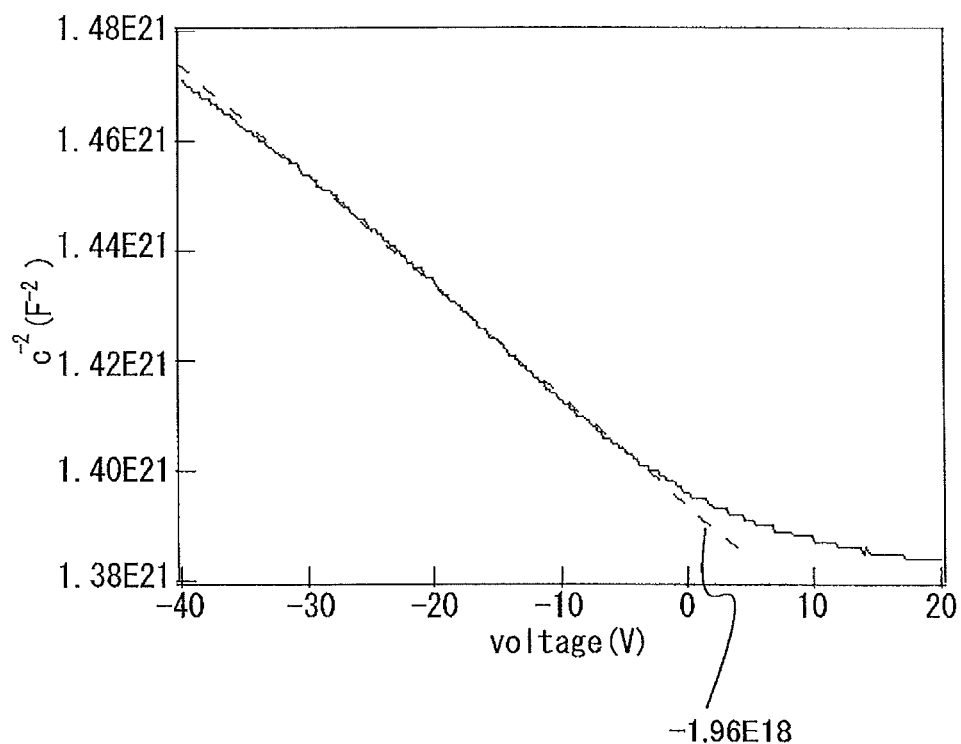

Next, C-V measurement results of the sample at 300 K are shown in FIG. 18A. According to the measurement results shown in FIG. 18A, a curve of $C^{-2}$ relative to the voltage is shown in FIG. 18B. Here, the carrier density can be obtained by substituting the gradient of a curve of $C^{-2}$ in a weak inversion state of the sample into Formula 2. In addition, in FIG. 18B, a curve of $C^{-2}$ is indicated by a solid line and the gradient of $C^{-2}$ in a weak inversion state is indicated by a broken line. The gradient of the curve was $-1.96 \times 10^{18}$ $F^{-2}$ $V^{-1}$.

$$N_d = -\left(\frac{2}{e\varepsilon_0\varepsilon}\right) \bigg/ \frac{d(1/C)^2}{dV}  \quad \text{[FORMULA 2]}$$

Note that e is the amount of charge per electron, $\varepsilon$ is relative permittivity, $\varepsilon_0$ is permittivity of vacuum, and $N_d$ is carrier density.

According to Formula 2, the carrier density of the oxide semiconductor in this example was $6 \times 10^{10}$ $cm^{-3}$. Accordingly, it is found that the carrier density of the oxide semiconductor in this example is extremely low.

Example 2

In this example, with regard to an oxide semiconductor film in which the number of hydrogen atoms are reduced by heat treatment, the results of TEM analysis are described.

First, a method for manufacturing a sample is described.

An oxide semiconductor film was formed by a sputtering method over a substrate 601.

Here, as the substrate 601, EAGLE XG substrate (manufactured by Corning Incorporated) was used. As the oxide semiconductor film, an In—Ga—Zn—O film 603 was deposited with the use of an oxide semiconductor target of $In_2O_3$: $Ga_2O_3$:ZnO=1:1:1. The sample is referred to as sample B which is a comparative example. The number of hydrogen atoms is not reduced in the sample B.

Next, heat treatment was performed on the In—Ga—Zn—O film 603 at 650° C. for one hour in a nitrogen gas atmosphere with the use of an electric furnace, whereby the number of hydrogen atoms was reduced. The In—Ga—Zn—O film on which heat treatment was performed is referred to as an oxide semiconductor film 605. The sample is referred to as sample A.

Figure 19A:
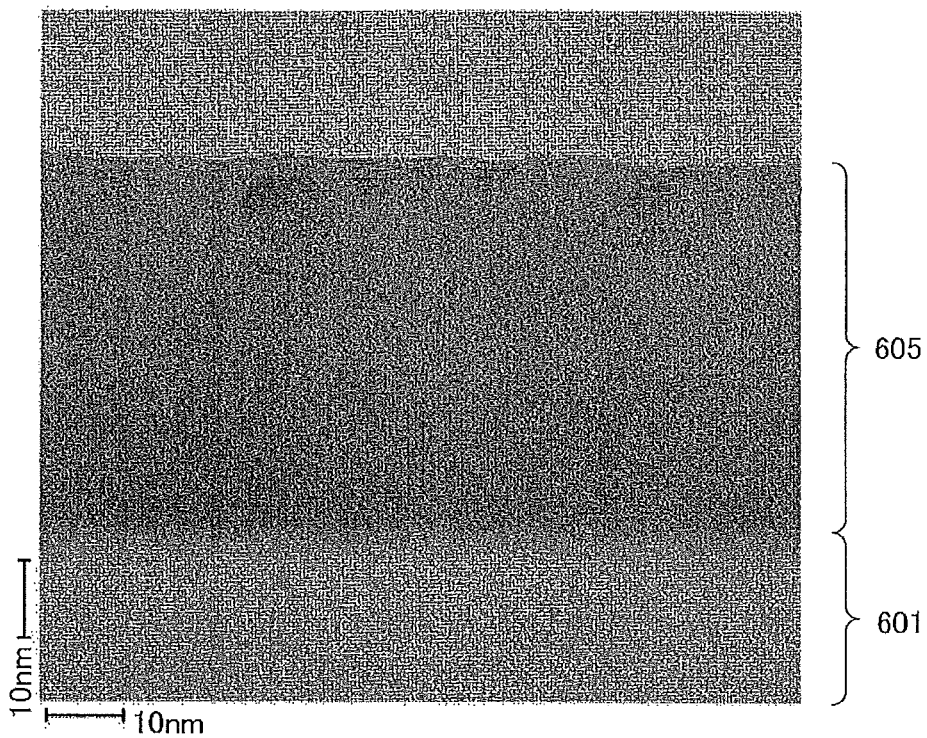
FIGS. 19A and 19B each show a TEM image at a cross section.
Figure 19B:
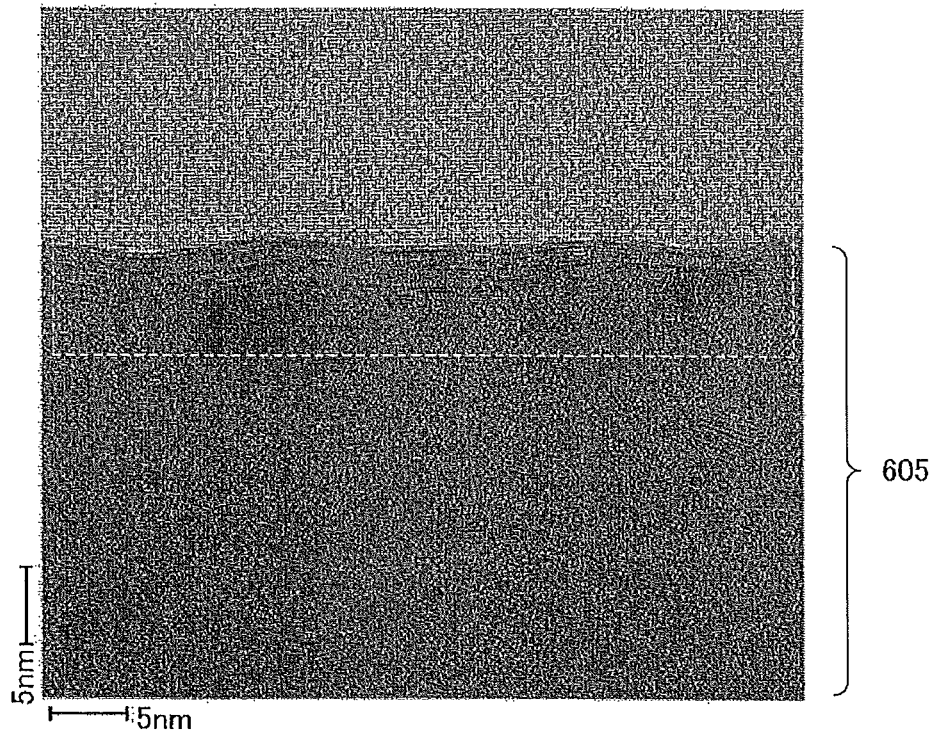
Figure 20A:
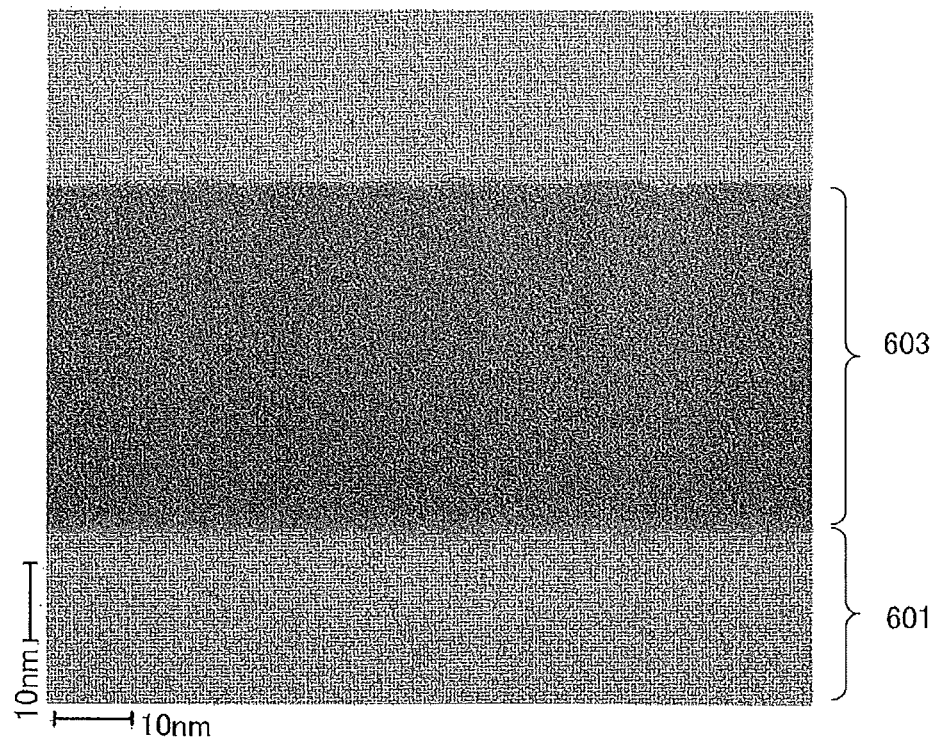
FIGS. 20A and 20B each show a TEM image at a cross section.
Figure 20B:
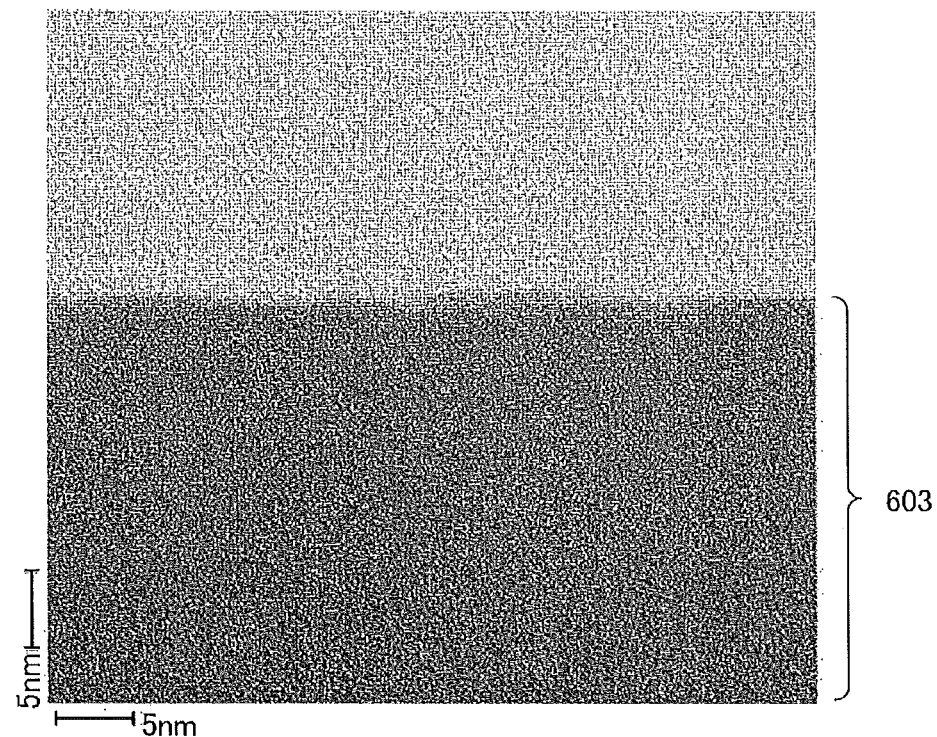

A cross section of each sample was observed with a high-resolution transmission electron microscope (TEM: "H9000-NAR" manufactured by Hitachi, Ltd.) at an acceleration voltage of 300 kV to examine a crystalline state. FIGS. 19A and 19B show cross-sectional photographs of the sample A and FIGS. 20A and 20B show cross-sectional photographs of the sample B. Note that FIG. 19A and FIG. 20A are low magnification photographs (two million-fold magnification) and FIG. 19B and FIG. 20B are high magnification photographs (four million-fold magnification).

A continuous lattice image was observed in a superficial portion in a cross section of the sample A on which heat treatment was performed in an electric furnace at 650° C. for one hour, as shown in FIGS. 19A and 19B. In particular, in the high magnification photograph of FIG. 19B, a clear lattice image is observed in a region surrounded by a white frame, and the existence of crystals whose crystal axes are aligned is indicated. Accordingly, it is found that the superficial portion of the In—Ga—Zn—O-based non-single-crystal film is crystallized by performing heat treatment in an electric furnace at 650° C. for one hour and a crystalline region is provided. Note that a clear continuous lattice image was not observed in a region except for the superficial portion and a state where microcrystalline particles exist here and there in an amorphous region was found. The particle size of the microcrystals was equal to or greater than 2 nm and equal to or less than or 4 nm.

On the other hand, a clear lattice image was not observed in any region in a thickness direction in the cross-sectional photographs of FIGS. 20A and 20B (the sample B) and it was found that the sample B is amorphous.

Figure 21A:
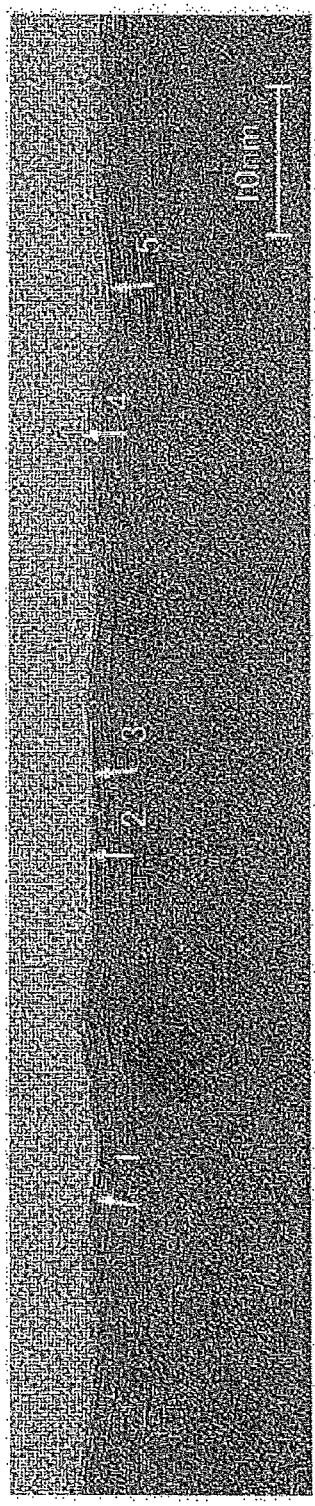
FIG. 21A shows an enlarged view of the superficial portion of the sample A and FIGS. 21B to 21F each illustrate an electron diffraction pattern of a crystalline region.
Figures 21B, 21C, 21D, 21E, 21F:
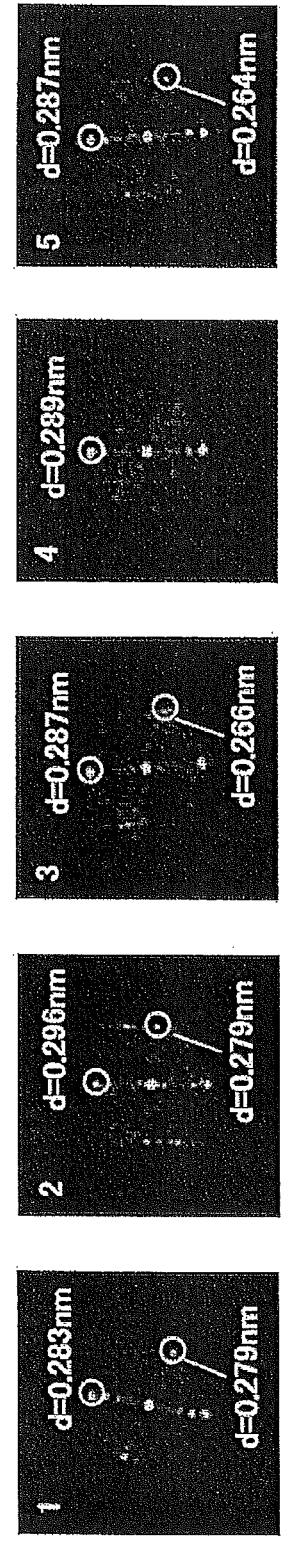

Next, FIG. 21A shows an enlarged photograph of the superficial portion of the sample A on which heat treatment was performed in an electric furnace at 650° C. for one hour and FIG. 21B shows an electron diffraction pattern of a crystalline region. Directional arrows 1 to 5 indicating directions where lattice images are aligned are illustrated in the enlarged photograph of the superficial portion (FIG. 21A), and needle crystals are grown in a direction perpendicular to a surface of the film. The electron diffraction patterns shown in FIGS. 21B, 21C, 21D, 21E, and 21F were observed at positions indicated by the arrows 1, 2, 3, 4, and 5, respectively, and a c-axis orientation is found.

From the results of analysis, it is found that the superficial portion of the sample on which heat treatment is performed in an electric furnace at 650° C. for one hour has a crystal region.

This application is based on Japanese Patent Application serial no. 2009-276454 filed with Japan Patent Office on Dec. 4, 2009, the entire contents of which are hereby incorporated by reference.

The invention claimed is:
1. A semiconductor device comprising:
an intrinsic or substantially intrinsic oxide semiconductor film that includes a channel formation region of a transistor and comprises indium, zinc and a metal other than indium and zinc;
a source electrode and a drain electrode electrically connected with the oxide semiconductor film; and
a gate electrode overlapping with the channel formation region with an insulating film therebetween,
wherein carrier density of the oxide semiconductor film is less than $1\times10^{12}$ cm$^{-3}$,
wherein an off-state current of the transistor is $1\times10^{-18}$ A/μm or less, and
wherein a relation of $E_c-E_f<E_g/2$ is satisfied where $E_g$ is a band gap of the oxide semiconductor film, $E_c$ is an energy at a bottom of a conduction band of the oxide semiconductor film, and $E_f$ is a Fermi energy of the oxide semiconductor film.

2. The semiconductor device according to claim 1, wherein hydrogen concentration of the oxide semiconductor film is less than $1\times10^{16}$ cm$^{-3}$.

3. The semiconductor device according to claim 1, wherein the gate electrode is provided over the oxide semiconductor film.

4. The semiconductor device according to claim 1, further comprising:
a second gate electrode overlapping with the gate electrode with the channel formation region therebetween; and
a second insulating film between the second gate electrode and the oxide semiconductor film.

5. The semiconductor device according to claim 1, wherein the metal other than indium and zinc is gallium.

6. The semiconductor device according to claim 1, wherein the channel formation region comprises a crystalline region in which c-axis is oriented in a direction substantially perpendicular to a surface of the oxide semiconductor film.

7. An electronic device including the semiconductor device according to claim 1.

8. A semiconductor device comprising:
an intrinsic or substantially intrinsic oxide semiconductor film that includes a channel formation region of a transistor and comprises indium, zinc and a metal other than indium and zinc;
a source electrode and a drain electrode electrically connected with the oxide semiconductor film; and
a gate electrode overlapping with the channel formation region with an insulating film therebetween,
wherein the channel formation region comprises a crystalline region in which c-axis is oriented in a direction substantially perpendicular to a surface of the oxide semiconductor film,
wherein carrier density of the oxide semiconductor film is less than $1\times10^{12}$ cm$^{-3}$, and
wherein a relation of $E_c-E_f<E_g/2$ is satisfied where $E_g$ is a band gap of the oxide semiconductor film, $E_c$ is an energy at a bottom of a conduction band of the oxide semiconductor film, and $E_f$ is a Fermi energy of the oxide semiconductor film.

9. The semiconductor device according to claim 8, wherein hydrogen concentration of the oxide semiconductor film is less than $1\times10^{16}$ cm$^{-3}$.

10. The semiconductor device according to claim 8, wherein the gate electrode is provided over the oxide semiconductor film.

11. The semiconductor device according to claim 8, further comprising:
a second gate electrode overlapping with the gate electrode with the channel formation region therebetween; and
a second insulating film between the second gate electrode and the oxide semiconductor film.

12. The semiconductor device according to claim 8, wherein the metal other than indium and zinc is gallium.

13. An electronic device including the semiconductor device according to claim 8.

14. A semiconductor device comprising:
an intrinsic or substantially intrinsic oxide semiconductor film that includes a channel formation region of a transistor and comprises indium, zinc and a metal other than indium and zinc;
a source electrode and a drain electrode electrically connected with the oxide semiconductor film; and
a gate electrode overlapping with the channel formation region with an insulating film therebetween,
wherein the channel formation region comprises microcrystals,
wherein carrier density of the oxide semiconductor film is less than $1\times10^{12}$ cm$^{-3}$, and
wherein a relation of $E_c-E_f<E_g/2$ is satisfied where $E_g$ is a band gap of the oxide semiconductor film, $E_c$ is an energy at a bottom of a conduction band of the oxide semiconductor film, and $E_f$ is a Fermi energy of the oxide semiconductor film.

15. The semiconductor device according to claim 14, wherein hydrogen concentration of the oxide semiconductor film is less than $1\times10^{16}$ cm$^{-3}$.

16. The semiconductor device according to claim 14, wherein the gate electrode is provided over the oxide semiconductor film.

17. The semiconductor device according to claim 14, further comprising:
a second gate electrode overlapping with the gate electrode with the channel formation region therebetween; and
a second insulating film between the second gate electrode and the oxide semiconductor film.

18. The semiconductor device according to claim 14, wherein the metal other than indium and zinc is gallium.

19. The semiconductor device according to claim 14, wherein particle size of the microcrystals is 2 nm or more and 4 nm or less.

20. An electronic device including the semiconductor device according to claim 14.

* * * * *